US012676604B2

(12) United States Patent
Peng et al.

(10) Patent No.: US 12,676,604 B2
(45) Date of Patent: Jul. 7, 2026

(54) METHOD FOR SIGNAL PROCESSING, CIRCUIT FOR SIGNAL PROCESSING, CHIP FOR SIGNAL PROCESSING, AND ELECTRONIC DEVICE

(71) Applicant: Shenzhen Goodix Technology Co., Ltd., Shenzhen (CN)

(72) Inventors: Jiangyang Peng, Shenzhen (CN); Yuqing Yang, Shenzhen (CN); Jie Dai, Shenzhen (CN)

(73) Assignee: SHENZHEN GOODIX TECHNOLOGY CO., LTD. (CN)

( * ) Notice: Subject to any disclaimer, the term of this patent is extended or adjusted under 35 U.S.C. 154(b) by 46 days.

(21) Appl. No.: 19/006,432

(22) Filed: Dec. 31, 2024

(65) Prior Publication Data

US 2026/0095171 A1 Apr. 2, 2026

(30) Foreign Application Priority Data

Sep. 30, 2024 (CN) .......................... 202411383860.8

(51) Int. Cl.
*H03K 7/08* (2006.01)
*H03F 3/217* (2006.01)

(52) U.S. Cl.
CPC ............... *H03K 7/08* (2013.01); *H03F 3/217* (2013.01); *H03F 2200/03* (2013.01); *H03F 2200/351* (2013.01)

(58) Field of Classification Search
CPC ............... H03F 2200/03; H03F 1/0277; H03F 2200/411; H03F 2200/432; H03F 3/2178;

H03F 3/30; H03F 3/183; H03F 3/217; H04W 88/02; H04W 52/027; H04W 4/80; H04W 52/0254; H03K 7/08; H03K 3/017;

(Continued)

(56) References Cited

U.S. PATENT DOCUMENTS 6,342,822 B1 1/2002 So
2008/0030267 A1* 2/2008 Yang ......................... H03F 1/26
330/10

(Continued)

FOREIGN PATENT DOCUMENTS

CN       116614113 A       8/2023
CN       118074683 A       5/2024
WO       WO2022151840 A1   7/2022

*Primary Examiner* — Eva Y Puente
(74) *Attorney, Agent, or Firm* — Emerson, Thomspn & Bennett, LLC; Roger D. Emerson; Peter R. Detorre

(57) ABSTRACT
Embodiments of the present disclosure provide a method for signal processing, a circuit for signal processing, a chip for signal processing, and an electronic device. The method for signal processing includes: performing PWM modulation on an input signal to obtain a PWM positive signal and a PWM negative signal; and outputting a positive output signal and a negative output signal based on the PWM positive signal and the PWM negative signal; wherein, in response to an absolute value of an amplitude of the input signal being larger than a threshold, one output signal of the positive output signal and the negative output signal does not include a pulse, and the other output signal of the positive output signal and the negative output signal includes 2 pulses within one pulse period. This solution can improve the performance of the output signal while improving the performance.

20 Claims, 23 Drawing Sheets

Performing PWM modulation on an input signal to obtain a PWM positive signal and a PWM negative signal
/101

Outputting a positive output signal and a negative output signal based on the PWM positive signal and the PWM negative signal
/102

(58) Field of Classification Search
CPC   H03K 4/06; H03K 5/24; H03K 19/20; H03K
17/162; H03K 4/066; H03K 17/6871;
H03K 5/1252
See application file for complete search history.

(56) References Cited

U.S. PATENT DOCUMENTS

| | | | | |
|---|---|---|---|---|
| 2011/0012674 A1* | 1/2011 | Midya | ................... | H03F 3/217 |
| | | | | 330/10 |
| 2011/0169679 A1* | 7/2011 | Teramoto | ........... | H03M 1/0836 |
| | | | | 341/144 |
| 2016/0211809 A1* | 7/2016 | Chang | .................. | H03F 3/2171 |
| 2017/0077882 A1* | 3/2017 | Wang | .................... | H03F 3/217 |
| 2021/0377404 A1 | 12/2021 | Nagata | | |
| 2023/0090431 A1* | 3/2023 | Banin | ..................... | H04B 1/04 |
| | | | | 375/295 |
| 2025/0233562 A1* | 7/2025 | Chiu | ...................... | H03F 3/187 |

* cited by examiner

METHOD FOR SIGNAL PROCESSING, CIRCUIT FOR SIGNAL PROCESSING, CHIP FOR SIGNAL PROCESSING, AND ELECTRONIC DEVICE

CROSS REFERENCE TO RELATED APPLICATIONS

This application claims priority to the Chinese Patent Application No. 202411383860.8, filed on Sep. 30, 2024, and entitled "METHOD FOR SIGNAL PROCESSING, CIRCUIT FOR SIGNAL PROCESSING, CHIP FOR SIGNAL PROCESSING, AND ELECTRONIC DEVICE", the disclosures of which is hereby incorporated by reference in its entirety.

TECHNICAL FIELD

Embodiments of the present disclosure relate to the technical field of electronics, and particularly relate to a method for signal processing, a circuit for signal processing, a chip for signal processing, and an electronic device.

BACKGROUND

Pulse-Width Modulation (PWM) is a technology that uses a digital output from a microprocessor to control an analog circuit, so that a pulse width is modulated to equivalently obtain a desired waveform (including shape and amplitude), that is, changing duty cycle to adjust voltage and frequency.

At present, an audio signal is amplified using a Class D power amplifier (also referred to as a digital power amplifier or a switching power amplifier) using the PWM technology.

However, the class D power amplifier will balance between performance and efficiency. Improvement of the performance will synchronously lead to decrease of the efficiency, which is particularly obvious when an absolute value of an amplitude of an input signal is large.

SUMMARY

In view of this, embodiments of the present disclosure provide a method for signal processing, a circuit for signal processing, a chip for signal processing, and an electronic device, to at least partially solve the above problems.

According to an embodiment in a first aspect of the present disclosure, a method for signal processing is provided, including: performing PWM modulation on an input signal to obtain a PWM positive signal and a PWM negative signal; and outputting a positive output signal and a negative output signal based on the PWM positive signal and the PWM negative signal; wherein, in response to an absolute value of an amplitude of the input signal being larger than a threshold, one output signal of the positive output signal and the negative output signal does not include a pulse, and the other output signal of the positive output signal and the negative output signal includes 2 pulses within one pulse period.

According to an embodiment in a second aspect of the present disclosure, a circuit for signal processing is provided, including: a modulation module configured to perform PWM modulation on an input signal to obtain a PWM positive signal and a PWM negative signal; and a power output module configured to output a positive output signal and a negative output signal based on the PWM positive signal and the PWM negative signal; wherein, in response to an absolute value of an amplitude of the input signal being larger than a threshold, one output signal of the positive output signal and the negative output signal does not include a pulse, and the other output signal of the positive output signal and the negative output signal includes 2 pulses within one pulse period.

According to an embodiment in a third aspect of the present disclosure, a chip for signal processing is provided, wherein the chip for signal processing is configured to implement the method according to the above first aspect.

According to an embodiment in a fourth aspect of the present disclosure, an electronic device is provided, including: a signal source, a signal receiving terminal, and an apparatus for signal processing, wherein the apparatus for signal processing includes the circuit for signal processing according to the above second aspect or the chip for signal processing according to the above third aspect; the apparatus for signal processing is connected between the signal source and the signal receiving terminal; the signal source is configured to transmit an input signal to the apparatus for signal processing; and the signal receiving terminal is configured to receive a positive output signal and a negative output signal outputted from the apparatus for signal processing.

According to solutions of embodiments of the present disclosure, PWM is performed on an input signal to obtain a PWM positive signal and a PWM negative signal, and a positive output signal and a negative output signal are outputted based on the PWM positive signal and the PWM negative signal, wherein, when an absolute value of an amplitude of the input signal is larger than a threshold, one of the positive output signal and the negative output signal does not include a pulse, and the other one thereof includes 2 pulses within one pulse period, that is, the positive output signal and the negative output signal does not have a common mode component, and a differential signal of the positive output signal and the negative output signal is concentrated on a single side, so that a differential mode pulse width of the positive output signal and the negative output signal does not have losses. Moreover, since pulses included in the positive output signal and the negative output signal are generated based on switching of a switching tube in a circuit, only one of the positive output signal and the negative output signal includes a pulse, thereby reducing the switching frequency in a process of generating the positive output signal and the negative output signal, and improving the output efficiency. In the PWM process, the number of occurrences of pulses per unit time is positively correlated to the suppression effects on the loop nonlinearity and noise. When the absolute value of the amplitude of the input signal is larger than the threshold, one of the positive output signal and the negative output signal includes 2 pulses within one pulse period, thereby improving the suppression effects on the loop nonlinearity and noise when the absolute value of the amplitude of the input signal is large, and improving the performance of the output signal.

BRIEF DESCRIPTION OF DRAWINGS

To more clearly describe technical solutions in embodiments of the present disclosure or the prior art, drawings to be used in the description of the embodiments or the prior art will be briefly introduced below. Apparently, the drawings in the description below are merely some embodiments disclosed in the embodiments of the present disclosure. For those of ordinary skills in the art, other drawings may also be obtained based on these drawings.

DETAILED DESCRIPTION

To enable those skilled in the art to better understand technical solutions of embodiments of the present disclosure, the technical solutions of the embodiments of the present disclosure will be clearly and completely described below with reference to the drawings in the embodiments of the present disclosure. Apparently, the described embodiments are merely some, instead of all, of the embodiments of the present disclosure. All other embodiments obtained by those of ordinary skills in the art based on some embodiments among the embodiments of the present disclosure should be encompassed within the scope of protection of the embodiments of the present disclosure.

The terms used in the present disclosure are intended merely to describe particular embodiments, and are not intended to limit the present disclosure. The singular forms of "a" and "the" used in the present disclosure and the appended claims are also intended to include plural forms, unless the context clearly indicates other meanings. It should be further understood that the term "and/or" used herein refers to and includes any or all possible combinations of one or more associated listed items.

It should be understood that various kinds of information may be described by using the terms, such as first, second, and third, in the present disclosure, but the information should not be limited to these terms. These terms are merely used to distinguish between information of a same type. For example, the first piece of information may also be called the second piece of information, and similarly, the second piece of information may also be called the first piece of information, without departing from the scope of the present disclosure. Depending on the context, as used herein, the word "if" may be interpreted as "at the time of . . . " or "when . . . " or "in response to determining."

In order to make objectives, technical solutions, and advantages of the present disclosure clearer, embodiments of the present disclosure will be further described in detail below with reference to the drawings.

Method for Signal Processing

Figure 1:
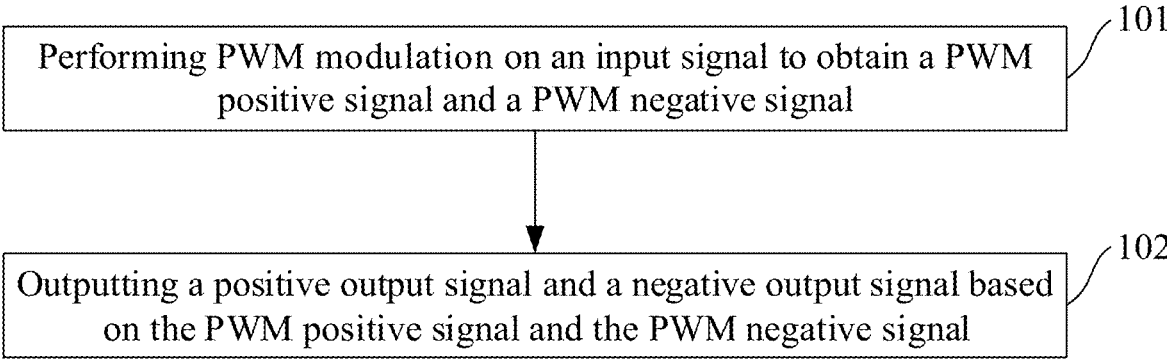
FIG. 1 is a flowchart of a method for signal processing in an embodiment of the present disclosure.

FIG. 1 is a flowchart of a method for signal processing in an embodiment of the present disclosure. As shown in FIG. 1, the method for signal processing includes the following steps:

Step 101: performing PWM modulation on an input signal to obtain a PWM positive signal and a PWM negative signal.

The input signal may include a positive input signal and a negative input signal, and the input signal may be an analog signal. The performing PWM modulation on the input signal may include a plurality of steps. For example, a differential mode signal of the positive input signal and the negative input signal included in the input signal is first coupled to an input terminal of a loop filter unit, filtered, and then transported to a comparison unit for comparison with a triangular wave. Then, logical operation is performed on the comparison result to obtain the PWM positive signal and the PWM negative signal.

The input signal may be a signal with PWM requirements, such as an audio signal.

Step 102: outputting a positive output signal and a negative output signal based on the PWM positive signal and the PWM negative signal.

After the PWM positive signal and the PWM negative signal are obtained, the PWM positive signal and the PWM negative signal may be processed by, e.g., amplification and inverse operation, to obtain the positive output signal and the negative output signal, and then output the positive output signal and negative output signal. In an example, when the input signal is the audio signal, the outputted positive output signal and negative output signal can be used to drive a speaker after being filtered (such as LC filtering).

Pulse widths of the PWM positive signal and the PWM negative signal are associated with an absolute value of an amplitude of the input signal, and the positive output signal and the negative output signal are obtained based on the PWM positive signal and the PWM negative signal, so that the positive output signal and the negative output signal are associated with the absolute value of the amplitude of the input signal. Specifically, in response to an absolute value of an amplitude of the input signal being larger than a threshold, one output signal of the positive output signal and the negative output signal does not include a pulse, and the other output signal of the positive output signal and the negative output signal includes 2 pulses within one pulse period. When the absolute value of the amplitude of the input signal is larger than the threshold, if the positive output signal does not include a pulse, the negative output signal includes 2 pulses within one pulse period, while if the negative output signal does not include a pulse, the positive output signal includes 2 pulses within one pulse period. It should be noted that the "including 2 pulses within one pulse period" means that there are, and there are only, 2 pulses within one pulse period.

The amplitude of the input signal refers to an amplitude of the differential mode signal of the positive input signal and the negative input signal. The signal strength of the input signal is positively correlated to the absolute value of the amplitude thereof. It should be noted that, for ease of description, the amplitude of the input signal described below refers to the amplitude of the input signal. The threshold is larger than 0 and smaller than a maximum value of the absolute value of the amplitude of the input signal.

In an example, when the absolute value of the amplitude of the input signal is smaller than the threshold, periods (frequencies) of the positive output signal and the negative output signal are same as periods (frequencies) of the PWM positive signal and the PWM negative signal, and periods (frequencies) of the PWM positive signal and the PWM negative signal are same as a period (frequency) of the triangular wave. When the absolute value of the amplitude of the input signal is larger than the threshold, the frequency of the positive output signal or the negative output signal is equal to 0, that is, one of the positive output signal and the negative output signal does not include a pulse.

In an embodiment of the present disclosure, PWM is performed on the input signal to obtain the PWM positive signal and the PWM negative signal, and the positive output signal and the negative output signal are outputted based on the PWM positive signal and the PWM negative signal, wherein, when the absolute value of the amplitude of the input signal is larger than the threshold, one of the positive output signal and the negative output signal does not include a pulse, and the other one thereof includes 2 pulses within one pulse period, that is, the positive output signal and the negative output signal does not have a common mode component, and a differential signal of the positive output signal and the negative output signal is concentrated on a single side, so that a differential mode pulse width of the positive output signal and the negative output signal does not have losses. Since the pulses included in the positive output signal and the negative output signal are generated based on switching of a switching tube in a circuit, one of the positive output signal and the negative output signal does not include a pulse within one pulse period, the other one of the positive output signal and the negative output signal includes 2 pulses, thereby increasing the occurrence frequency of pulses without increasing the switching frequency of the switching tube compared to the case where each of the positive output signal and the negative output signal includes 1 pulse, and improving the performance of the output signal while ensuring the output efficiency. In the PWM process, the number of occurrences of pulses per unit time is positively correlated to the suppression effects on the loop nonlinearity and noise. When the absolute value of the amplitude of the input signal is larger than the threshold, one of the positive output signal and the negative output signal includes 2 pulses within one pulse period, thereby improving the suppression effects on the loop nonlinearity and noise when the absolute value of the amplitude of the input signal is large, and improving the performance of the output signal.

In a possible implementation, when the absolute value of the amplitude of the input signal is larger than 0 and smaller than the threshold, each of the positive output signal and the negative output signal includes 1 pulse within one pulse period, and a pulse width of the differential mode signal of the positive output signal and the negative output signal is larger than 0, that is, a pulse width of the pulse included in the positive output signal is different from a pulse width of the pulse included in the negative output signal. Further, the differential mode signal of the positive output signal and the negative output signal includes 1 pulse within one pulse period.

When the absolute value of the amplitude of the input signal is larger than 0 and smaller than the threshold, each of the positive output signal and the negative output signal includes 1 pulse within each pulse period, and there is a differential mode signal between the positive output signal and the negative output signal. The pulse width of the differential mode signal is associated with the absolute value of the amplitude of the input signal, and when the amplitude of the input signal is not equal to 0, the pulse width of the differential mode signal of the positive output signal and the negative output signal is larger than 0.

In an embodiment of the present disclosure, when the absolute value of the amplitude of the input signal is larger than 0 and smaller than the threshold, each of the positive output signal and the negative output signal includes 1 pulse within one pulse period, and the pulse width of the differential mode signal of the positive output signal and the negative output signal is larger than 0. Since the pulse width of the differential mode signal of the positive output signal and the negative output signal is associated with the absolute value of the amplitude of the input signal, not only are the performance and efficiency of the output signal ensured when the absolute value of the amplitude of the input signal is large, but also the output signal can reflect the input signal changes when the absolute value of the amplitude of the input signal is small, thereby ensuring the reliability of signal processing.

In a possible implementation, when the amplitude of the input signal is equal to 0, each of the positive output signal and the negative output signal includes 1 pulse within one pulse period, and the pulse width of the differential mode signal of the positive output signal and the negative output signal is equal to 0, that is, the differential mode signal of the positive output signal and the negative output signal does not include any pulse.

The positive output signal and the negative output signal match the input signal. When the amplitude of the input signal changes, the differential mode signal of the positive output signal and the negative output signal needs to change accordingly, so as to ensure the correctness of signal processing. When the amplitude of the input signal is equal to 0, each of the positive output signal and the negative output signal includes 1 pulse within one pulse period, and the pulse width of the differential mode signal of the positive output signal and the negative output signal is equal to 0, thereby ensuring that the differential mode signal of the positive output signal and the negative output signal matches the input signal, and ensuring the reliability and accuracy of signal processing.

Figure 26:
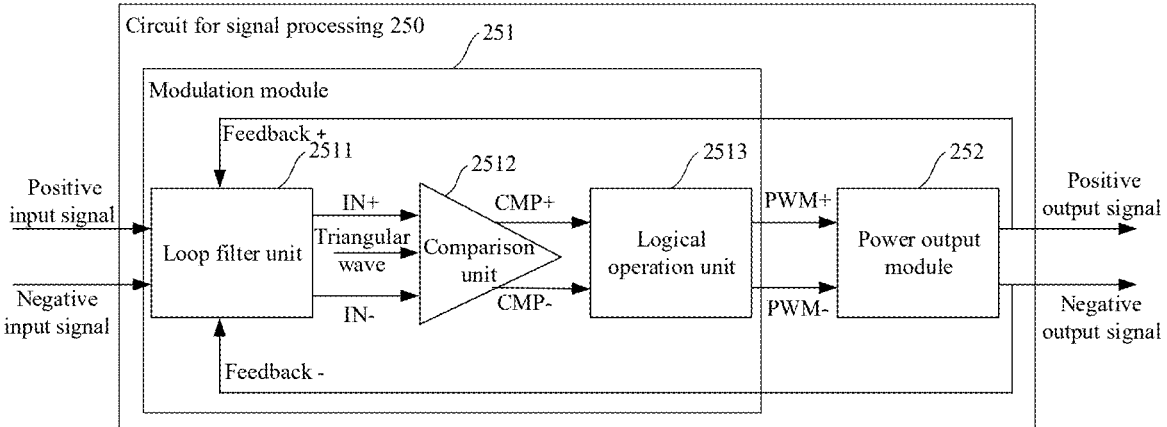
FIG. 26 is a schematic diagram of a circuit for signal processing in another embodiment of the present disclosure.

In an embodiment of the present disclosure, since the number and pulse widths of pulses included in a common mode signal of the positive output signal and the negative output signal are negatively correlated to the efficiency of signal processing, the efficiency of signal processing may indicate power consumption. When the amplitude of the input signal is equal to 0, each of the positive output signal and the negative output signal includes 1 pulse within each pulse period, so that the common mode signal of the positive output signal and the negative output signal includes a small number of pulses, thereby ensuring low power consumption in a standby state. When the amplitude of the input signal is equal to 0, each of the positive output signal and the negative output signal includes 1 pulse, thereby ensuring normal running of a feedback loop during signal processing, and ensuring the performance of signal processing. Referring to FIG. 26, the feedback loop is composed of a loop filter unit, a comparison unit, a logical operation unit, and a power output module. The differential mode signal of the positive input signal and the negative input signal is coupled to the input terminal of the loop filter unit, filtered, and then transmitted to the comparison unit for comparison with the triangular wave. Then, logical operation is performed on the comparison result to obtain the PWM positive signal and the PWM negative signal. The power output module generates the positive output signal and the negative output signal based on the PWM positive signal and the PWM negative signal. The power output module feeds back the positive output signal and the negative output signal to the loop filter unit, and the loop filter unit filters the positive input signal and the negative input signal based on the feedback positive output signal and negative output signal.

In a possible implementation, the pulse width of the differential mode signal of the positive output signal and the negative output signal is positively correlated to the absolute value of the amplitude of the input signal.

When the amplitude of the input signal is equal to 0, the pulse width of the differential mode signal of the positive output signal and the negative output signal is equal to 0. When the absolute value of the amplitude of the input signal is larger than 0, the pulse width of the differential mode signal of the positive output signal and the negative output signal is larger than 0, and the pulse width of the differential mode signal of the positive output signal and the negative output signal is positively correlated to the absolute value of the amplitude of the input signal, thereby ensuring that after the input signal is processed, the input signals can be correctly reflected in the differential mode signal of the positive output signal and the negative output signal, and ensuring the accuracy and reliability of signal processing.

In a possible implementation, the input signal may be processed based on a preset delay duration. Based on different absolute values of the amplitude of the input signal, the pulse widths of the pulses included in the positive output signal and the negative output signal satisfy the following relationship with the delay duration:

(1) when the amplitude of the input signal is equal to 0, the pulse widths of the pulses included in the positive output signal and the negative output signal are each equal to the delay duration;

(2) when the absolute value of the amplitude of the input signal is larger than 0 and smaller than the threshold, a pulse width of a pulse included in one output signal of the positive output signal and the negative output signal is larger than the delay duration, and a pulse width of a pulse included in the other output signal of the positive output signal and the negative output signal is smaller than the delay duration; and (3) when the absolute value of the amplitude of the input signal is larger than the threshold, a pulse width of at least one pulse included in the positive output signal or the negative output signal is larger than the delay duration.

When the amplitude of the input signal is equal to 0, each of the positive output signal and the negative output signal includes 1 pulse with a pulse width equal to the delay duration, and the pulse width of the differential mode signal of the positive output signal and the negative output signal is equal to 0, that is, rising edges and falling edges of the pulses included in the positive output signal and the negative output signal are all temporally aligned, so that the differential mode signal of the positive output signal and the negative output signal matches the input signal, thereby ensuring the accuracy of signal processing.

When the absolute value of the amplitude of the input signal is larger than 0 and smaller than the threshold, each of the positive output signal and the negative output signal includes 1 pulse. When the pulse width of the pulse included in the positive output signal is larger than the delay duration, the pulse width of the pulse included in the negative output signal is smaller than the delay duration. When the pulse width of the pulse included in the negative output signal is larger than the delay duration, the pulse width of the pulse included in the positive output signal is smaller than the delay duration. When the absolute value of the amplitude of the input signal is larger than 0 and smaller than the threshold, neither rising edges nor falling edges of the pulses included in the positive output signal and the negative output signal are temporally aligned, and midpoints of the pulses included in the positive output signal and the negative output signal are temporally aligned, so that the pulse width of the differential mode signal of the positive output signal and the negative output signal is not equal to 0, and as the absolute value of the amplitude of the input signal increases (decreases), the pulse width of the differential mode signal of the positive output signal and the negative output signal increases (decreases) accordingly, so that the differential mode signal of the positive output signal and the negative output signal matches the input signal to ensure the accuracy of signal processing.

When the absolute value of the amplitude of the input signal is larger than the threshold, one output signal of the positive output signal and the negative output signal includes 2 pulses, the other output signal of the positive output signal and the negative output signal does not include a pulse, and a pulse width of at least one pulse in the output signal including the 2 pulses is larger than the delay duration. When the absolute value of the amplitude of the input signal is larger than the threshold, if the positive output signal includes 2 pulses, a pulse width of at least one pulse among the 2 pulses included in the positive output signal is larger than the delay duration, and if the negative output signal includes 2 pulses, a pulse width of at least one pulse among the 2 pulses included in the negative output signal is larger than the delay duration. When the absolute value of the amplitude of the input signal is larger than the threshold, as the absolute value of the amplitude of the input signal increases (decreases), a sum of the pulse widths of the 2 pulses included in the positive output signal or the negative output signal increases (decreases) accordingly, so that the differential mode signal of the positive output signal and the negative output signal matches the input signal to ensure the accuracy of signal processing.

In an embodiment of the present disclosure, the pulse widths of the pulses included in the positive output signal and the negative output signal are associated with the preset delay duration, the performance of the output signal is associated with the pulse widths of the pulses included in the positive output signal and the negative output signal, and an appropriate delay duration may be set based on requirements for the performance of the output signal. For example, the delay duration may be 1/40-1/10 of a triangular wave period, and on the premise of satisfying the requirements for the performance of the output signal, a small delay duration is set, so that when the amplitude of the input signal is equal to 0, the pulse widths of the pulses included in the positive output signal and the negative output signal are small, thereby reducing the standby power consumption.

Figure 2:
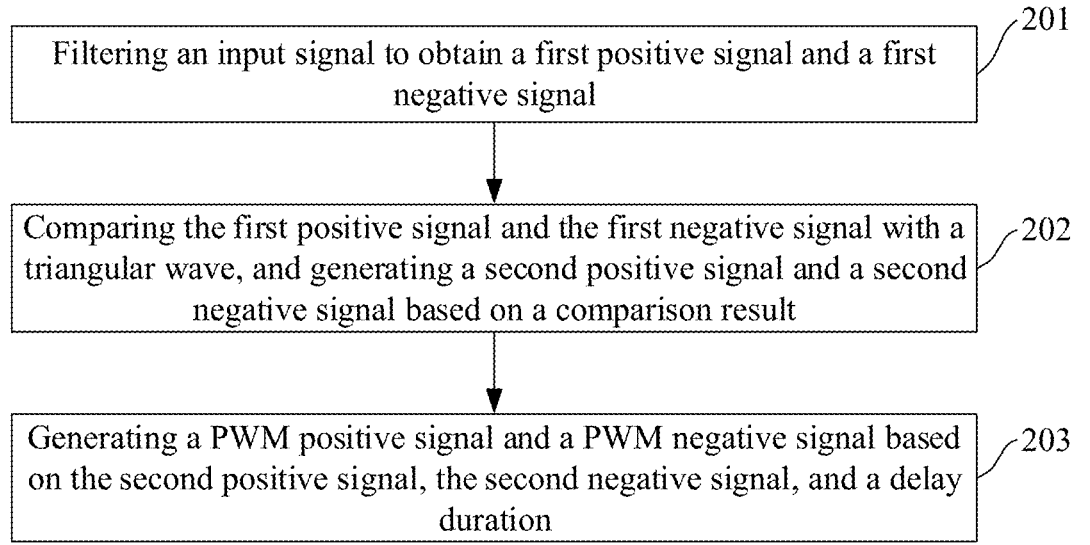
FIG. 2 is a flowchart of a PWM method in an embodiment of the present disclosure.

In a possible implementation, when PWM is performed on the input signal, a square wave signal may be first generated based on the input signal, and then the PWM positive signal and the PWM negative signal may be generated based on the generated square wave signal and the delay duration. Based on a flow chart of the PWM method as shown in FIG. 2, PWM may be performed on the input signal in accordance with a method including the following steps:

Step 201: filtering the input signal to obtain a first positive signal and a first negative signal.

The input signal includes a positive input signal and a negative input signal. The positive input signal and the negative input signal are filtered, to obtain the first positive signal and the first negative signal. For example, the differential mode signal of the positive input signal and the negative input signal are coupled to the input terminal of the loop filter unit, to filter the positive input signal and the negative input signal through the loop filter unit, thus obtaining the first positive input signal and the first negative signal.

In an example, the loop filter unit does not perform inverse operation at its output terminal, a waveform of the first positive signal matches a waveform of the positive input signal, and a waveform of the first negative signal matches a waveform of the negative input signal. In another example, the loop filter unit performs inverse operation at its output terminal, a waveform of the first positive signal matches a waveform of the negative input signal, and a waveform of the first negative signal matches a waveform of the positive input signal. The output terminal of the loop filter unit outputs the first positive signal and the first negative signal.

Step 202: comparing the first positive signal and the first negative signal with a triangular wave, and generating a second positive signal and a second negative signal based on a comparison result.

After the first positive signal and the first negative signal are acquired, the first positive signal and the first negative signal may be inputted into the comparison unit respectively, so that the comparison unit compares the first positive signal and the first negative signal respectively with the triangular wave, to generate the second positive signal based on a comparison result between the first positive signal and the triangular wave, and generate the second negative signal based on a comparison result between the first negative signal and the triangular wave.

When comparing the first positive signal and the first negative signal with the triangular wave, the comparison unit determines the second positive signal/the second negative signal based on a magnitude relationship between the first positive signal/the first negative signal and the triangular wave.

Figure 9:
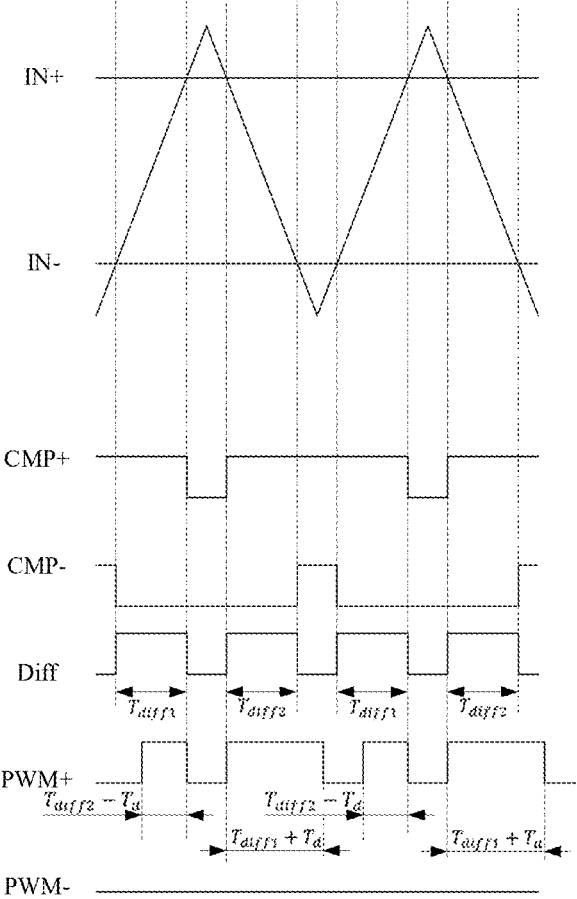
FIG. 9 is a schematic diagram of a PWM positive signal and a PWM negative signal when an absolute value of an amplitude of an input signal is larger than a threshold in an embodiment of the present disclosure.

In an example, based on a schematic diagram of the second positive signal and the second negative signal as shown in FIG. 9, a signal segment in which a first positive signal IN+ (first negative signal IN−) is larger than the triangular wave corresponds to a high level of a second positive signal CMP+ (second negative signal CMP−), and a signal segment in which the first positive signal IN+ (the first negative signal IN−) is smaller than the triangular wave corresponds to a low level of the second positive signal CMP+ (the second negative signal CMP−).

Figure 11:
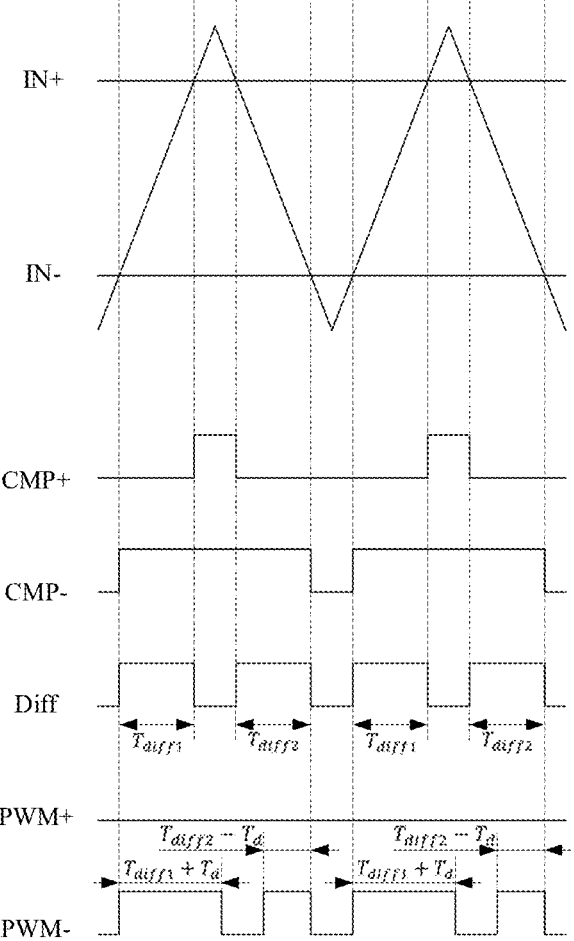
FIG. 11 is a schematic diagram of a PWM positive signal and a PWM negative signal when an absolute value of an amplitude of an input signal is larger than a threshold in still another embodiment of the present disclosure.

In another example, based on a schematic diagram of the second positive signal and the second negative signal as shown in FIG. 11, a signal segment in which a first positive signal IN+ (first negative signal IN−) is larger than the triangular wave corresponds to a low level of a second positive signal CMP+ (second negative signal CMP−), and a signal segment in which the first positive signal IN+ (the first negative signal IN−) is smaller than the triangular wave corresponds to a high level of the second positive signal CMP+ (the second negative signal CMP−).

It should be noted that FIGS. 9 and 11 show the triangular wave in two pulse periods. For ease of description, in subsequent embodiments, unless otherwise specified, the first positive signal is represented by IN+, the first negative signal is represented by IN−, the second positive signal is represented by CMP+, and the second negative signal is represented by CMP−, the PWM positive signal is represented by PWM+, and the PWM negative signal is represented by PWM−.

When the IN+ and the IN− signals are compared with the triangular wave to generate the CMP+ and the CMP−, inverse operation may be performed, or may not be performed. When inverse operation is not performed, waveforms of the CMP+ and the CMP− are as shown in FIG. 9. When inverse operation is performed, waveforms of the CMP+ and the CMP− are as shown in FIG. 11. Whether inverse operation is performed in a process of generating the CMP+ and the CMP− may be set based on application scenario requirements, thereby satisfying different requirements, and improving the applicability of the method for signal processing in embodiments of the present disclosure.

Step 203: generating the PWM positive signal and the PWM negative signal based on the second positive signal, the second negative signal, and a delay duration.

After the second positive signal and the second negative signal are generated, logical operation may be performed on the second positive signal and the second negative signal based on the delay duration, and then the PWM positive signal and the PWM negative signal may be generated.

In an embodiment of the present disclosure, the positive output signal and the negative output signal are generated based on the PWM positive signal and the PWM negative signal, and when the absolute value of the amplitude of the input signal is larger than the threshold and smaller than the threshold, the PWM positive signal and the PWM negative signal are each generated based on the second positive signal, the second negative signal, and the delay duration. The PWM positive signal and the PWM negative signal are generated by feedback without the need of using a complex feedback network, so that signal processing is simpler, thereby reducing the costs of the circuit for signal processing.

In a possible implementation, when the amplitude of the input signal is equal to 0, pulse widths of pulses included in the PWM positive signal and the PWM negative signal are each equal to the delay duration, and leading edges of the pulses included in the PWM positive signal and the PWM negative signal are all temporally aligned to rising edges of pulses included in the second positive signal and the second negative signal.

The pulses included in the second positive signal and the second negative signal may be low levels, or may be high levels. In the second positive signal and the second negative signal, if the pulses are low levels, leading edges of the pulses are falling edges, and trailing edges of the pulses are rising edges. If the pulses are high levels, the leading edges of the pulses are rising edges, and the trailing edges of the pulses are falling edges. The PWM positive signal and the PWM negative signal are described below taking the pulses included in the second positive signal (the second negative signal) being low levels or high levels as an example.

Figure 3:
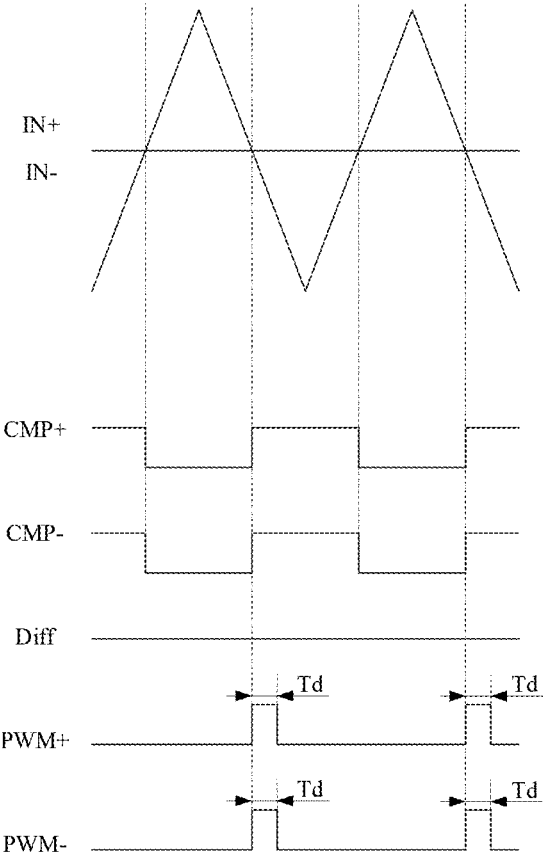
FIG. 3 is a schematic diagram of a PWM positive signal and a PWM negative signal when an amplitude of an input signal is equal to 0 in an embodiment of the present disclosure.

When inverse operation is not performed in the process of generating the CMP+ and the CMP−, the PWM positive signal and the PWM negative signal are as shown in FIG. 3. Pulses included in the CMP+ and the CMP− are low levels, pulses included in the PWM+ and the PWM− are high levels, rising edges of pulses included in the PWM+ are temporally aligned to rising edges (trailing edges) of the pulses included in the CMP+ and the CMP−, and pulse widths of the pulses included in the PWM+ and the PWM− are each equal to the delay duration $T_d$. The Diff is used to represent the differential mode signal of the CMP+ and the CMP−.

Figure 4:
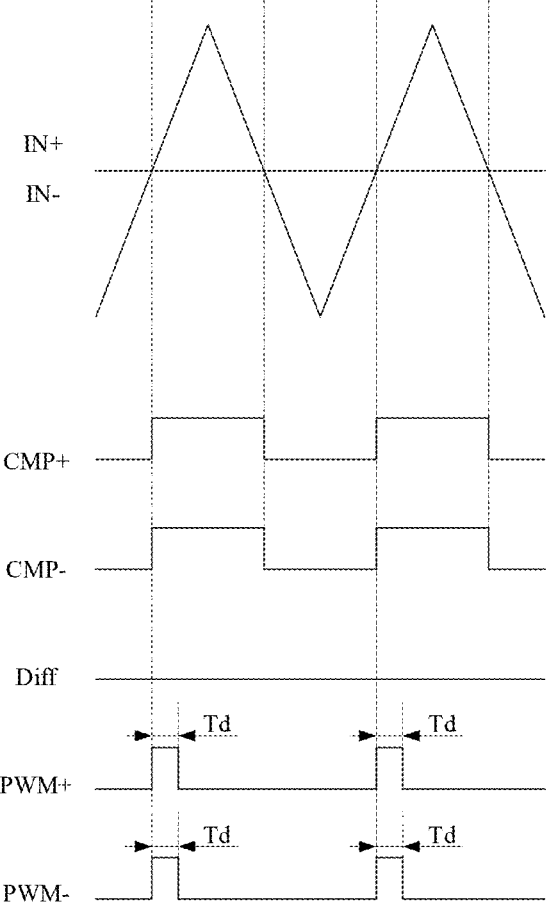
FIG. 4 is a schematic diagram of a PWM positive signal and a PWM negative signal when an amplitude of an input signal is equal to 0 in another embodiment of the present disclosure.

When inverse operation is performed in the process of generating the CMP+ and the CMP−, the PWM positive signal and the PWM negative signal are as shown in FIG. 4. The pulses included in the CMP+ and the CMP− are high levels, the pulses included in the PWM+ and the PWM− are high levels, the rising edges of the pulses included in the PWM+ are temporally aligned to the rising edges (leading edges) of the pulses included in the CMP+ and the CMP−, and the pulse widths of the pulses included in the PWM+ and the PWM− are each equal to the delay duration $T_d$. The Diff is used to represent the differential mode signal of the CMP+ and the CMP−.

It should be noted that FIGS. 3 and 4 show the PWM+ and the PWM− in two pulse periods.

In an embodiment of the present disclosure, when the amplitude of the input signal is equal to 0, the pulse widths of the pulses included in the PWM positive signal and the PWM negative signal are equal to the delay duration, and leading edges of the pulses included in the PWM positive signal and the PWM negative signal are all temporally aligned to rising edges of the pulses included in the second positive signal and the second negative signal, to ensure that the differential mode signal of the PWM positive signal and the PWM negative signal does not include any pulse, so that the differential mode signal of the PWM positive signal and the PWM negative signal matches the input signal, thereby ensuring the accuracy of signal processing. In addition, a small delay duration is set, so that the pulse widths of the pulses included in the PWM positive signal and the PWM negative signal are small when the amplitude of the input signal is equal to 0, thereby reducing the standby power consumption.

In a possible implementation, when the absolute value of the amplitude of the input signal is larger than 0 and smaller than the threshold, based on the magnitude relationship between the first positive signal and the first negative signal, pulse widths of pulses included in the PWM positive signal are different from pulse widths of pulses included in the PWM negative signal. When the absolute value of the amplitude of the input signal is larger than 0 and smaller than the threshold, rising edge of the pulses included in the PWM positive signal are temporally aligned to rising edges of the pulses included in the second positive signal, and rising edges of the pulses included in the PWM negative signal are temporally aligned to rising edges of pulses included in the second negative signal; if the first positive signal is larger than the first negative signal, the pulse widths of the pulse included in the PWM positive signal are larger than the pulse widths of the pulses included in the PWM negative signal; and if the first positive signal is smaller than the first negative signal, the pulse widths of the pulses included in the PWM positive signal are smaller than the pulse widths of the pulses included in the PWM negative signal.

Figure 5:
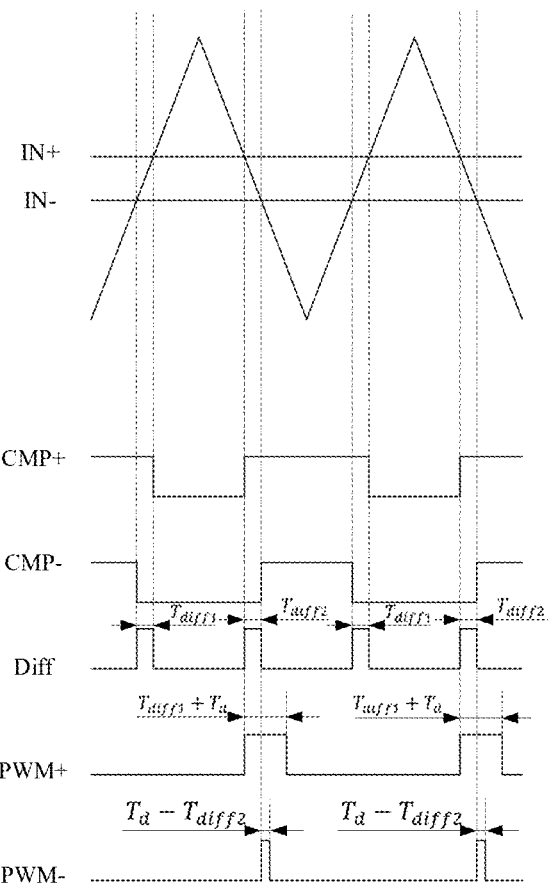
FIG. 5 is a schematic diagram of a PWM positive signal and a PWM negative signal when an absolute value of an amplitude of an input signal is smaller than a threshold in an embodiment of the present disclosure.

When inverse operation is not performed in the process of generating the CMP+ and the CMP−, if the absolute value of the amplitude of the input signal is larger than 0 and smaller than the threshold, and the IN+ is larger than the IN−, the PWM positive signal and the PWM negative signal are as shown in FIG. 5. Referring to FIG. 5, the pulses included in the CMP+ and the CMP− are low levels, the pulses included in the PWM+ and the PWM− are high levels, the pulse width of the pulse included in the PWM+ is equal to $T_{diff\,1}+T_d$, the pulse width of the pulse included in the PWM− is equal to $T_d-T_{diff\,2}$, a rising edge of the pulse included in the PWM+ is temporally aligned to a rising edge of a pulse included in the CMP+, and a rising edge of the pulse included in the PWM− is temporally aligned to a rising edge of a pulse included in the CMP−. The Diff is used to represent the differential mode signal of the CMP+ and the CMP−, and the $T_{diff\,1}$ and the $T_{diff\,2}$ are used to represent pulse widths of 2 pulses included in the Diff.

Figure 6:
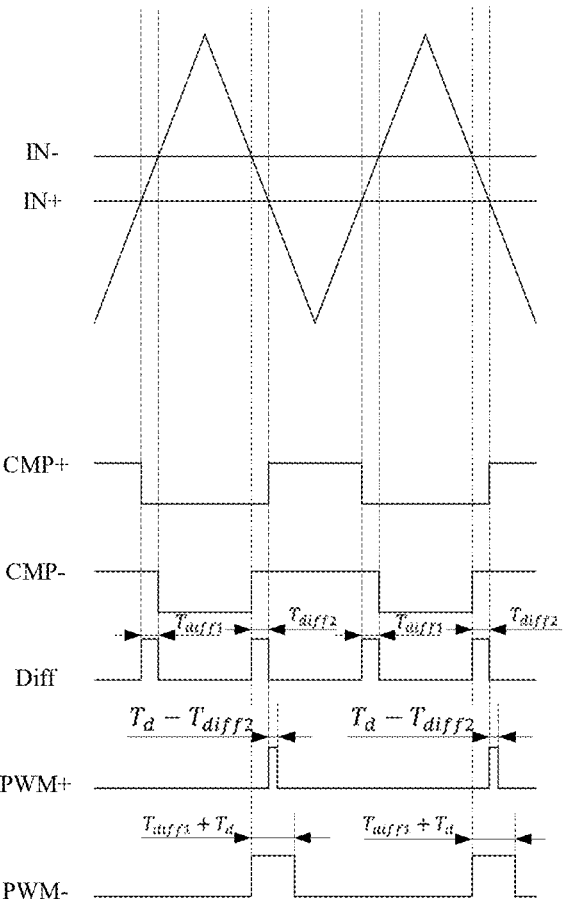
FIG. 6 is a schematic diagram of a PWM positive signal and a PWM negative signal when an absolute value of an amplitude of an input signal is smaller than a threshold in another embodiment of the present disclosure.

When inverse operation is not performed in the process of generating the CMP+ and the CMP−, if the absolute value of the amplitude of the input signal is larger than 0 and smaller than the threshold, and the IN+ is smaller than the IN−, the PWM positive signal and the PWM negative signal are as shown in FIG. 6. Referring to FIG. 6, the pulses included in the CMP+ and the CMP− are low levels, the pulses included in the PWM+ and the PWM− are high levels, the pulse width of the pulse included in the PWM+ is equal to $T_d-T_{diff\,2}$, the pulse width of the pulse included in the PWM− is equal to $T_{diff\,1}+T_d$, a rising edge of the pulse included in the PWM+ is temporally aligned to a rising edge of a pulse included in the CMP+, and a rising edge of the pulse included in the PWM− is temporally aligned to a rising edge of a pulse included in the CMP−. The Diff is used to represent the differential mode signal of the CMP+ and the CMP−, and the $T_{diff\,1}$ and the $T_{diff\,2}$ are used to represent pulse widths of 2 pulses included in the Diff.

Figure 7:
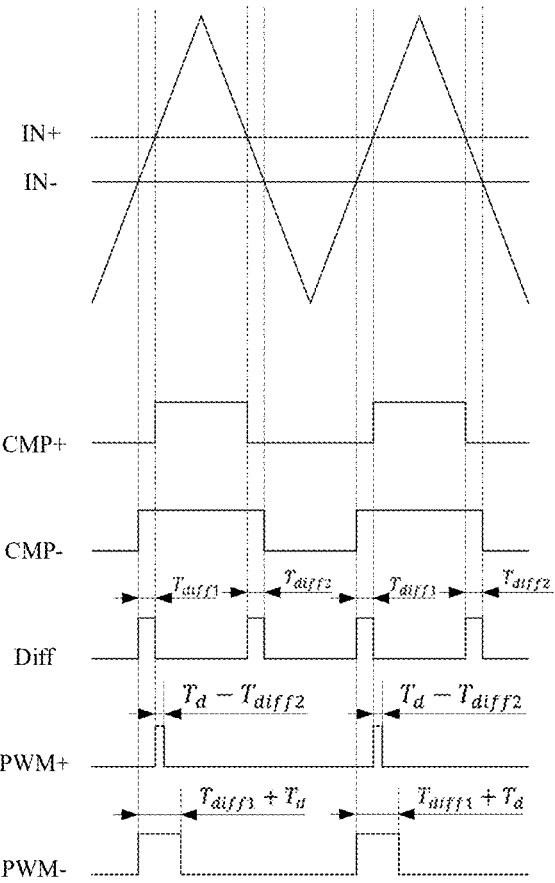
FIG. 7 is a schematic diagram of a PWM positive signal and a PWM negative signal when an absolute value of an amplitude of an input signal is smaller than a threshold in still another embodiment of the present disclosure.

When inverse operation is performed in the process of generating the CMP+ and the CMP−, if the absolute value of the amplitude of the input signal is larger than 0 and smaller than the threshold, and the IN+ is larger than the IN−, the PWM positive signal and the PWM negative signal are as shown in FIG. 7. Referring to FIG. 7, the pulses included in the CMP+ and the CMP− are high levels, the pulses included in the PWM+ and the PWM− are high levels, the pulse width of the pulse included in the PWM+ is equal to $T_d-T_{diff\,2}$, the pulse width of the pulse included in the PWM− is equal to $T_{diff\,1}+T_d$, a rising edge of the pulse included in the PWM+ is temporally aligned to a rising edge of a pulse included in the CMP+, and a rising edge of the pulse included in the PWM− is temporally aligned to a rising edge of a pulse included in the CMP−. The Diff is used to represent the differential mode signal of the CMP+ and the CMP−, and the $T_{diff\,1}$ and the $T_{diff\,2}$ are used to represent pulse widths of 2 pulses included in the Diff.

Figure 8:
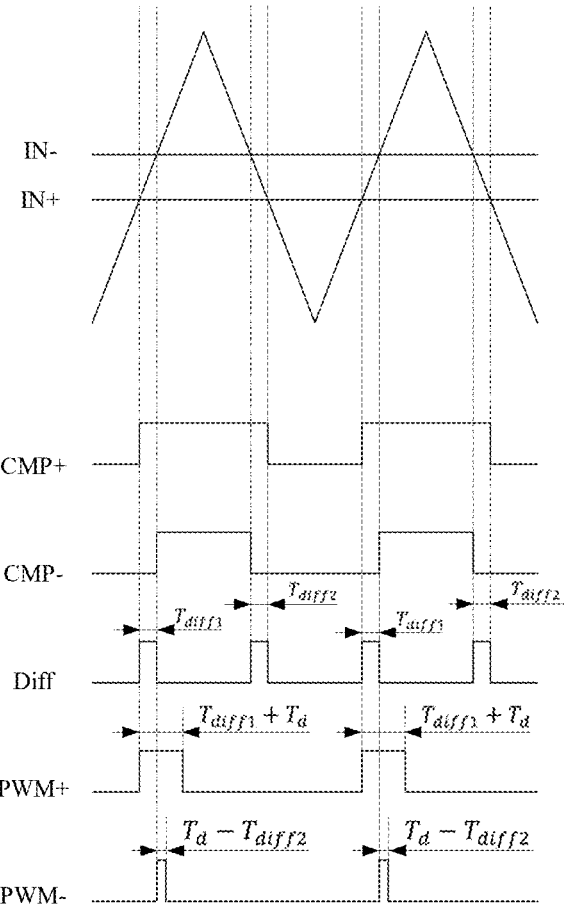
FIG. 8 is a schematic diagram of a PWM positive signal and a PWM negative signal when an absolute value of an amplitude of an input signal is smaller than a threshold in yet another embodiment of the present disclosure.

When inverse operation is performed in the process of generating the CMP+ and the CMP−, if the absolute value of the amplitude of the input signal is larger than 0 and smaller than the threshold, and the IN+ is smaller than the IN−, the PWM positive signal and the PWM negative signal are as shown in FIG. 8. Referring to FIG. 8, the pulses included in the CMP+ and the CMP− are high levels, the pulses included in the PWM+ and the PWM− are high levels, the pulse width of the pulse included in the PWM+ is equal to $T_{diff\,1}+T_d$, the pulse width of the pulse included in the PWM− is equal to $T_d-T_{diff\,2}$, a rising edge of the pulse included in the PWM+ is temporally aligned to a rising edge of a pulse included in the CMP+, and a rising edge of the pulse included in the PWM− is temporally aligned to a rising edge of a pulse included in the CMP−. The Diff is used to represent the differential mode signal of the CMP+ and the CMP−, and the $T_{diff\,1}$ and the $T_{diff\,2}$ are used to represent pulse widths of 2 pulses included in the Diff.

It should be noted that FIGS. 5-8 show the PWM+ and the PWM− in two pulse periods. As shown in FIGS. 5-8, when the absolute value of the amplitude of the input signal is larger than 0 and smaller than the threshold, neither the rising edges nor the falling edges of the pulses included in the PWM+ and the PWM− are temporally aligned, and midpoints of the pulses included in the PWM+ and the PWM− are temporally aligned.

In the case where inverse operation is not performed in the process of generating the CMP+ and the CMP−, when the absolute value of the amplitude of the input signal is larger than 0 and smaller than the threshold, if the IN+ is larger than the IN−, referring to FIG. 5, as the absolute value of the amplitude of the input signal increases, the $T_{diff\,1}$ and the $T_{diff\,2}$ increase, a pulse width of a pulse included in the PWM+ increases from $T_d$, a pulse width of a pulse included in the PWM− decreases from $T_d$, and a sum of pulse widths of pulses included in the differential mode signal of the PWM+ and the PWM− is equal to $T_{diff\,1}+T_{diff\,2}$.

In the case where inverse operation is not performed in the process of generating the CMP+ and the CMP−, when the absolute value of the amplitude of the input signal is larger than 0 and smaller than the threshold, if the IN+ is smaller than the IN−, referring to FIG. 6, as the absolute value of the amplitude of the input signal increases, the $T_{diff\,1}$ and the $T_{diff\,2}$ increase, a pulse width of a pulse included in the PWM− increases from $T_d$, a pulse width of a pulse included in the PWM+ decreases from $T_d$, and the sum of the pulse widths of the pulses included in the differential mode signal of the PWM+ and the PWM− is equal to $T_{diff\,1}+T_{diff\,2}$.

In the case where inverse operation is performed in the process of generating the CMP+ and the CMP−, when the absolute value of the amplitude of the input signal is larger than 0 and smaller than the threshold, if the IN+ is larger than the IN−, referring to FIG. 7, as the absolute value of the amplitude of the input signal increases, the $T_{diff\,1}$ and the $T_{diff\,2}$ increase, a pulse width of a pulse included in the PWM+ decreases from $T_d$, a pulse width of a pulse included in the PWM− increases from $T_d$, and the sum of the pulse widths of the pulses included in the differential mode signal of the PWM+ and the PWM− is equal to $T_{diff\,1}+T_{diff\,2}$.

In the case where inverse operation is performed in the process of generating the CMP+ and the CMP−, when the absolute value of the amplitude of the input signal is larger than 0 and smaller than the threshold, if the IN+ is smaller than the IN−, referring to FIG. 8, as the absolute value of the amplitude of the input signal increases, the $T_{diff\,1}$ and the $T_{diff\,2}$ increase, a pulse width of a pulse included in the PWM+ increases from $T_d$, a pulse width of a pulse included in the PWM− decreases from $T_d$, and the sum of the pulse widths of the pulses included in the differential mode signal of the PWM+ and the PWM− is equal to $T_{diff\,1}+T_{diff\,2}$.

In an embodiment of the present disclosure, when the absolute value of the amplitude of the input signal is larger than 0 and smaller than the threshold, each of the PWM+ and the PWM− includes 1 pulse, the sum of the pulse widths of the differential mode signal of the PWM+ and the PWM− is equal to $T_{diff\,1}+T_{diff\,2}$, and when the absolute value of the amplitude of the input signal changes, the $T_{diff\,1}+T_{diff\,2}$ changes accordingly, so that the input signal changes can be reflected in the differential mode signal of the PWM+ and the PWM−, thereby ensuring the accuracy of signal processing.

In a possible implementation, when the absolute value of the amplitude of the input signal is larger than the threshold, based on the magnitude relationship between the first positive signal and the first negative signal, the pulse widths of the pulses included in the PWM positive signal are different from the pulse widths of the pulses included in the PWM negative signal.

When the absolute value of the amplitude of the input signal is larger than the threshold, if pulses included in the second positive signal and the second negative signal are low levels, and the first positive signal is larger than the first negative signal, pulse widths of 2 pulses included in the PWM positive signal are $T_{diff\ 1}+T_d$ and $T_{diff\ 2}-T_d$ respectively, the PWM negative signal does not include a pulse, a rising edge of a pulse with the pulse width $T_{diff\ 1}+T_d$ included in the PWM positive signal is temporally aligned to a rising edge of a pulse included in the second positive signal, and a falling edge of a pulse with the pulse width $T_{diff2}-T_d$ included in the PWM positive signal is temporally aligned to a falling edge of a pulse included in the second positive signal.

When inverse operation is not performed in the process of generating the CMP+ and the CMP−, the pulses included in the second positive signal and the second negative signal are low levels. If the absolute value of the amplitude of the input signal is larger than the threshold, and the IN+ is larger than the IN−, the PWM positive signal and the PWM negative signal are as shown in FIG. 9. Referring to FIG. 9, the pulses included in the CMP+ and the CMP− are low levels, the pulses included in the PWM+ are high levels, the PWM+ includes 2 pulses with pulse widths of $T_{diff\ 1}+T_d$ and $T_{diff\ 2}-T_d$ respectively, the PWM− does not include a pulse, a rising edge of a pulse with the pulse width $T_{diff\ 1}+T_d$ included in the PWM+ is temporally aligned to a rising edge of a pulse included in the CMP+, and a falling edge of a pulse with the pulse width $T_{diff\ 2}-T_d$ included in the PWM+ is temporally aligned to a falling edge of a pulse included in the CMP+. The Diff is used to represent the differential mode signal of the CMP+ and the CMP−, and the $T_{diff\ 1}$ and the $T_{diff\ 2}$ are used to represent pulse widths of 2 pulses included in the Diff.

When the absolute value of the amplitude of the input signal is larger than the threshold, if the pulses included in the second positive signal and the second negative signal are low levels, and the first positive signal is smaller than the first negative signal, pulse widths of 2 pulses included in the PWM negative signal are $T_{diff\ 1}+T_d$ and $T_{diff\ 2}-T_d$ respectively, the PWM positive signal does not include a pulse, a rising edge of a pulse with the pulse width $T_{diff\ 1}+T_d$ included in the PWM negative signal is temporally aligned to a rising edge of the second negative signal, and a falling edge of a pulse with the pulse width $T_{diff2}-T_d$ included in the PWM negative signal is temporally aligned to a falling edge of the second negative signal.

Figure 10:
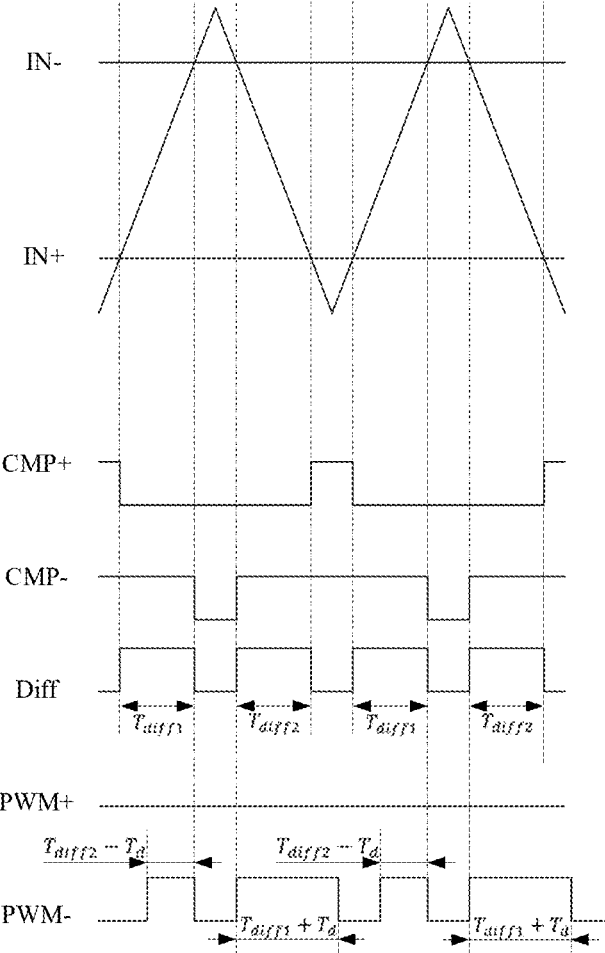
FIG. 10 is a schematic diagram of a PWM positive signal and a PWM negative signal when an absolute value of an amplitude of an input signal is larger than a threshold in another embodiment of the present disclosure.

When inverse operation is not performed in the process of generating the CMP+ and the CMP−, the pulses included in the second positive signal and the second negative signal are low levels. If the absolute value of the amplitude of the input signal is larger than the threshold, and the IN+ is smaller than the IN−, the PWM positive signal and the PWM negative signal are as shown in FIG. 10. Referring to FIG. 10, the pulses included in the CMP+ and the CMP− are low levels, the pulses included in the PWM− are high levels, the PWM− includes 2 pulses with pulse widths of $T_{diff\ 1}+T_d$ and $T_{diff\ 2}-T_d$ respectively, the PWM+ does not include a pulse, a rising edge of a pulse with the pulse width $T_{diff\ 1}+T_d$ included in the PWM− is temporally aligned to a rising edge of a pulse included in the CMP−, and a falling edge of a pulse with the pulse width $T_{diff\ 2}-T_d$ included in the PWM− is temporally aligned to a falling edge of a pulse included in the CMP−. The Diff is used to represent the differential mode signal of the CMP+ and the CMP−, and the $T_{diff\ 1}$ and the $T_{diff\ 2}$ are used to represent pulse widths of 2 pulses included in the Diff.

When the absolute value of the amplitude of the input signal is larger than the threshold, if the pulses included in the second positive signal and the second negative signal are high levels, and the first positive signal is larger than the first negative signal, pulse widths of 2 pulses included in the PWM negative signal are $T_{diff\ 1}+T_d$ and $T_{diff\ 2}-T_d$ respectively, the PWM positive signal does not include a pulse, a rising edge of a pulse with the pulse width $T_{diff\ 1}+T_d$ included in the PWM negative signal is temporally aligned to a rising edge of the second negative signal, and a falling edge of a pulse with the pulse width $T_{diff2}-T_d$ included in the PWM negative signal is temporally aligned to a falling edge of the second negative signal.

When inverse operation is performed in the process of generating the CMP+ and the CMP−, the pulses included in the second positive signal and the second negative signal are high levels. If the absolute value of the amplitude of the input signal is larger than the threshold, and the IN+ is larger than the IN−, the PWM positive signal and the PWM negative signal are as shown in FIG. 11. Referring to FIG. 11, the pulses included in the CMP+ and the CMP− are high levels, the pulses included in the PWM− are high levels, the PWM− includes 2 pulses with pulse widths of $T_{diff\ 1}+T_d$ and $T_{diff\ 2}-T_d$ respectively, the PWM+ does not include a pulse, a rising edge of a pulse with the pulse width $T_{diff\ 1}+T_d$ included in the PWM− is temporally aligned to a rising edge of a pulse included in the CMP−, and a falling edge of a pulse with the pulse width $T_{diff\ 2}-T_d$ included in the PWM− is temporally aligned to a falling edge of a pulse included in the CMP−. The Diff is used to represent the differential mode signal of the CMP+ and the CMP−, and the $T_{diff\ 1}$ and the $T_{diff\ 2}$ are used to represent pulse widths of 2 pulses included in the Diff.

When the absolute value of the amplitude of the input signal is larger than the threshold, if the pulses included in the second positive signal and the second negative signal are high levels, and the first positive signal is smaller than the first negative signal, pulse widths of 2 pulses included in the PWM positive signal are $T_{diff\ 1}+T_d$ and $T_{diff\ 2}-T_d$ respectively, the PWM negative signal does not include a pulse, a rising edge of a pulse with the pulse width $T_{diff\ 1}+T_d$ included in the PWM positive signal is temporally aligned to a rising edge of the second positive signal, and a falling edge of a pulse with the pulse width $T_{diff\ 2}-T_d$ included in the PWM positive signal is temporally aligned to a falling edge of the second positive signal.

Figure 12:
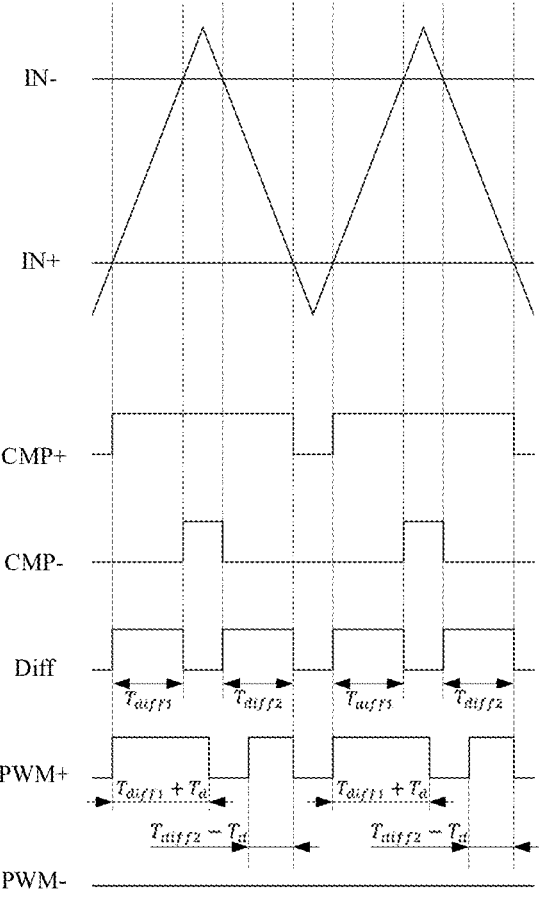
FIG. 12 is a schematic diagram of a PWM positive signal and a PWM negative signal when an absolute value of an amplitude of an input signal is larger than a threshold in yet an embodiment of the present disclosure.

When inverse operation is performed in the process of generating the CMP+ and the CMP−, the pulses included in the second positive signal and the second negative signal are high levels. If the absolute value of the amplitude of the input signal is larger than the threshold, and the IN+ is smaller than the IN−, the PWM positive signal and the PWM negative signal are as shown in FIG. 12. Referring to FIG. 12, the pulses included in the CMP+ and the CMP− are high levels, the pulses included in the PWM+ are high levels, the PWM+ includes 2 pulses with pulse widths of $T_{diff\ 1}+T_d$ and $T_{diff\ 2}-T_d$ respectively, the PWM− does not include a pulse, a rising edge of a pulse with the pulse width $T_{diff\ 1}+T_d$ included in the PWM+ is temporally aligned to a rising edge of a pulse included in the CMP+, and a falling edge of a pulse with the pulse width $T_{diff\ 2}-T_d$ included in the PWM+ is temporally aligned to a falling edge of a pulse included in the CMP+. The Diff is used to represent the differential mode signal of the CMP+ and the CMP−, and the $T_{diff\ 1}$ and the $T_{diff\ 2}$ are used to represent pulse widths of 2 pulses included in the Diff.

It should be noted that FIGS. 9-12 show the PWM+ and the PWM− in two pulse periods. Referring to FIGS. 9-12, when the absolute value of the amplitude of the input signal is larger than the threshold, as the absolute value of the amplitude of the input signal increases, the $T_{diff\ 1}$ and the $T_{diff\ 2}$ increase, a pulse width of a pulse with the pulse width $T_{diff\ 1}+T_d$ included in the PWM+ or the PWM− increases from $2T_d$, a pulse width of a pulse with the pulse width $T_{diff\ 2}-T_d$ included in the PWM+ or the PWM− increases from 0, and the sum of the pulse widths of the pulses included in the differential mode signal of the PWM+ and the PWM− is equal to $T_{diff\ 1}+T_{diff\ 2}$.

In an embodiment of the present disclosure, when the absolute value of the amplitude of the input signal is larger than the threshold, one of the PWM+ and the PWM− includes 2 pulses, and the other one thereof does not include a pulse. On the premise that the triangular wave is at a certain frequency, the PWM+ or the PWM− includes 2 pulses within one pulse period, thereby improving the suppression effects on the loop nonlinearity and noise, and improving the performance of the output signal. One of the PWM+ and the PWM− includes a pulse, while the other one thereof does not include a pulse, that is, the PWM+ and the PWM− do not have a common mode component, and a differential signal of the PWM+ and the PWM− is concentrated on a single side, so that the differential mode pulse width of the PWM+ and the PWM− has no losses, and the switching frequency in the process of generating the positive output signal and the negative is reduced, thereby improving the output efficiency.

Figure 13:
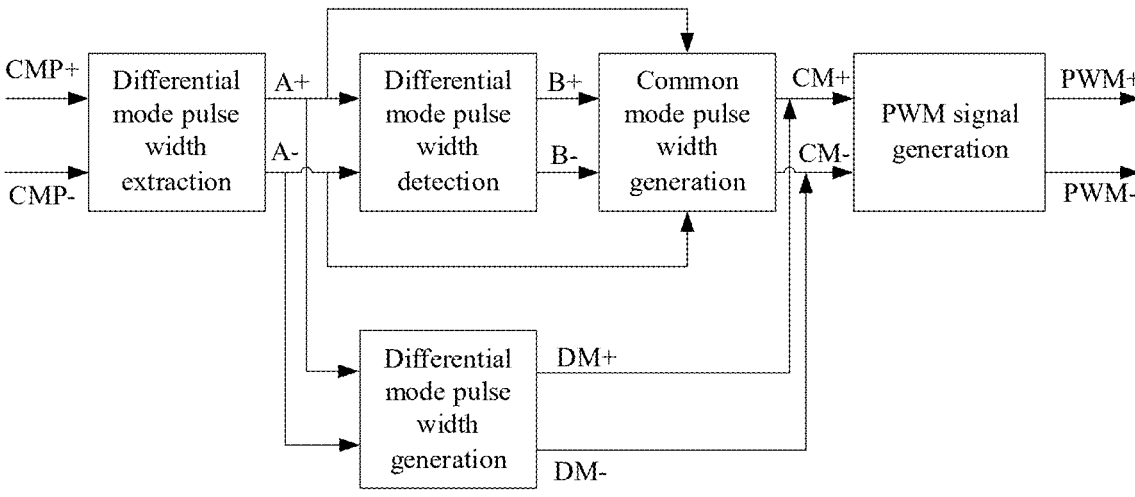
FIG. 13 is a schematic diagram of a process of generating a PWM positive signal and a PWM negative signal in an embodiment of the present disclosure.

In a possible implementation, FIG. 13 shows a schematic diagram of a process of generating the PWM+ and the PWM− in an embodiment of the present disclosure. As shown in FIG. 13, the generating the PWM+ and the PWM− includes processes, such as differential mode pulse width extraction, differential mode pulse width detection, common mode pulse width generation, differential mode pulse width generation, and PWM signal generation.

The process of differential mode pulse width extraction includes: performing differential mode pulse width extraction on the CMP+ and the CMP−, to obtain a first positive differential mode signal A+ and a first negative differential mode signal A−.

The process of differential mode pulse width detection includes: performing differential mode pulse width detection on the first positive differential mode signal A+ and the first negative differential mode signal A−, to obtain a second positive differential mode signal B+ and a second negative differential mode signal B−.

The process of common mode pulse width generation includes: performing common mode pulse width generation based on the first positive differential mode signal A+, the first negative differential mode signal A−, the second positive differential mode signal B+, and the second negative differential mode signal B−, to obtain a positive common mode signal CM+ and a negative common mode signal CM−.

The process of differential mode pulse width generation includes: performing differential mode pulse width generation based on the first positive differential mode signal A+ and the first negative differential mode signal A−, to obtain a third positive differential mode signal DM+ and a third negative differential mode signal DM−.

The process of PWM signal generation includes: performing PWM signal generation based on the positive common mode signal CM+, the negative common mode signal CM−, the third positive differential mode signal DM+, the third negative differential mode signal DM−, and the preset delay duration, to obtain the PWM+ and the PWM−.

In an embodiment of the present disclosure, the PWM+ and the PWM− are obtained by performing, e.g., differential mode pulse width extraction, differential mode pulse width detection, common mode pulse width generation, differential mode pulse width generation, and PWM signal generation based on the CMP+ and the PWM−. The pulse widths of the CMP+ and the CMP− can be determined by differential mode pulse width detection, and then the PWM+ and the PWM− are generated based on the pulse widths of the CMP+ and the CMP−, to ensure the quality of signal processing.

Figure 14:
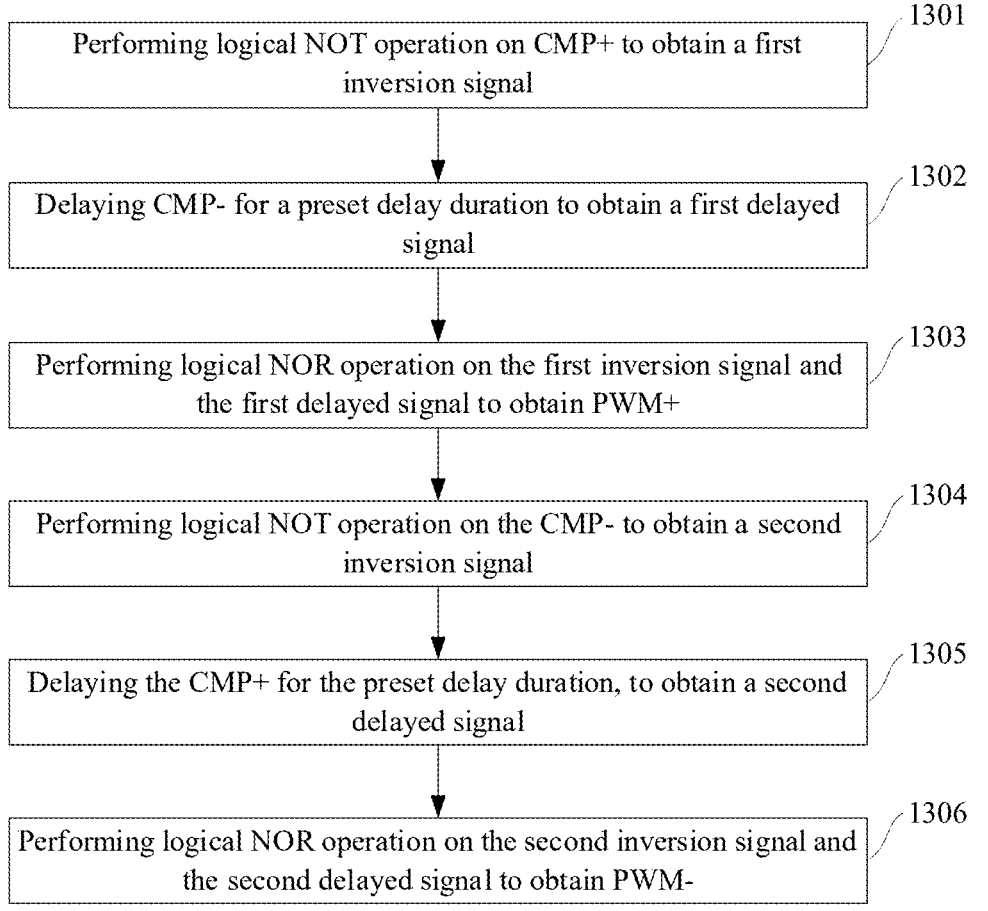
FIG. 14 is a flowchart of a method for generating a PWM positive signal and a PWM negative signal in an embodiment of the present disclosure.

In a possible implementation, when the PWM+ and the PWM− are generated based on the CMP+, the CMP−, and the delay duration $T_d$, logical operation can be performed on one of the CMP+ and the CMP− after inversion, to obtain the PWM+ and the PWM−. FIG. 14 shows a flow chart of a method for generating PWM+ and PWM− in an embodiment of the present disclosure. As shown in FIG. 14, the method includes the following steps:

Step 1401: performing logical NOT operation on CMP+ to obtain a first inversion signal;

Step 1402: delaying CMP− for a preset delay duration to obtain a first delayed signal;

Step 1403: performing logical NOR operation on the first inversion signal and the first delayed signal to obtain the PWM+;

Step 1404: performing logical NOT operation on the CMP− to obtain a second inversion signal;

Step 1405: delaying the CMP+ for the preset delay duration to obtain a second delayed signal; and Step 1406: performing logical NOR operation on the second inversion signal and the second delayed signal to obtain the PWM−.

Figure 15:
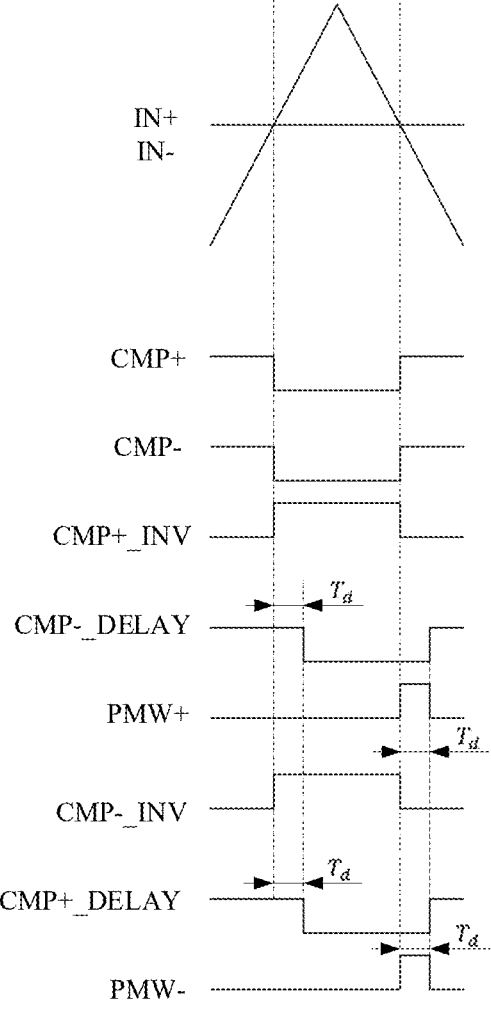
FIG. 15 is a schematic diagram of a process of generating a PWM positive signal and a PWM negative signal when an amplitude of an input signal is equal to 0 in an embodiment of the present disclosure.

Based on the method shown in FIG. 14, and based on magnitudes of IN+ and IN−, the process of generating the PWM+ and the PWM− from input signals of different amplitudes and waveform features of the PWM+ and the PWM− are illustrated below:

In the case where inverse operation is not performed in the process of generating the CMP+ and the CMP−, when the amplitude of the input signal is equal to 0, that is, the IN+ is equal to the IN−, the process of generating the PWM+ and the PWM− is as shown in FIG. 15. Logical NOT operation is performed on the CMP+ to obtain CMP+_INV, CMP− is delayed for $T_d$ to obtain CMP−_DELAY, and logical NOR operation is performed on the CMP+_INV and the CMP−_DELAY to obtain the PWM+. Logical NOT operation is performed on the CMP− to obtain the CMP−_INV, the CMP+ is delayed for $T_d$ to obtain the CMP+_DELAY, and logical NOR operation is performed on the CMP−_INV and the CMP+_DELAY to obtain the PWM−. Each of the PWM+ and the PWM− includes 1 pulse with a pulse width $T_d$, and rising edges of pulses included in the PWM+ and the PWM− are temporally aligned to rising edges of pulses included in the CMP+ and the CMP−, consistent with the PWM+ and the PWM− shown in FIG. 3.

Figure 16:
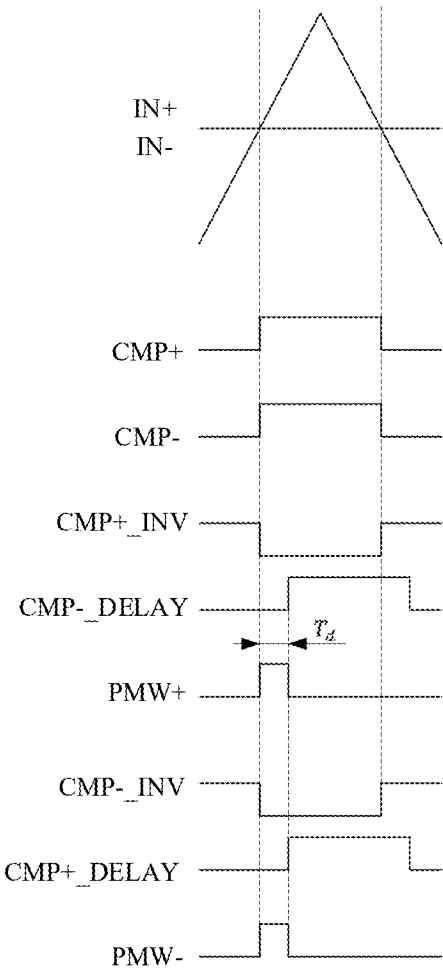
FIG. 16 is a schematic diagram of a process of generating a PWM positive signal and a PWM negative signal when an amplitude of an input signal is equal to 0 in another embodiment of the present disclosure.

In the case where inverse operation is performed in the process of generating the CMP+ and the CMP−, when the amplitude of the input signal is equal to 0, that is, the IN+ is equal to the IN−, the process of generating the PWM+ and the PWM− is as shown in FIG. 16. Logical NOT operation is performed on the CMP+ to obtain the CMP+_INV, the CMP– is delayed for $T_d$ to obtain the CMP–_DELAY, and logical NOR operation is performed on the CMP+_INV and the CMP–_DELAY to obtain the PWM+. Logical NOT operation is performed on the CMP– to obtain the CMP–_INV, the CMP+ is delayed for $T_d$ to obtain the CMP+_DELAY, and logical NOR operation is performed on the CMP–_INV and the CMP+_DELAY to obtain the PWM–. Each of the PWM+ and the PWM– includes 1 pulse with a pulse width $T_d$, and rising edges of pulses included in the PWM+ and the PWM– are temporally aligned to rising edges of pulses included in the CMP+ and the CMP–, consistent with the PWM+ and the PWM– shown in FIG. 4.

Figure 17:
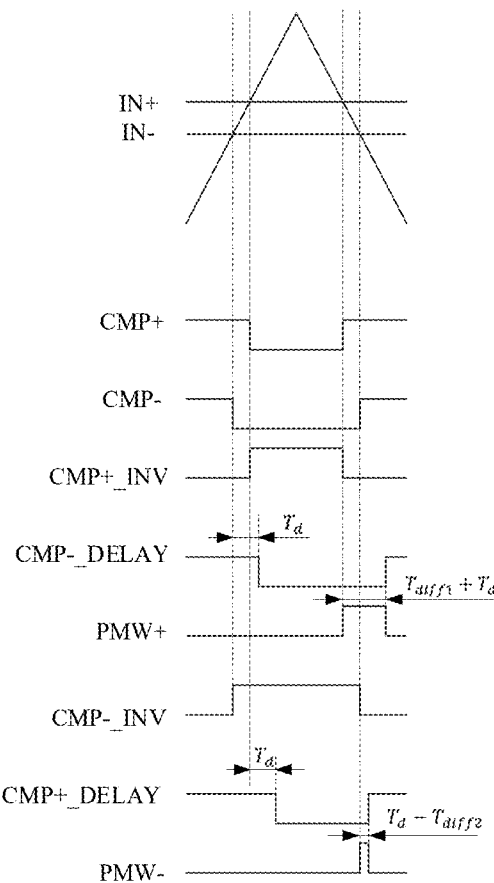
FIG. 17 is a schematic diagram of a process of generating a PWM positive signal and a PWM negative signal when an absolute value of an amplitude of an input signal is smaller than a threshold in an embodiment of the present disclosure.

In the case where inverse operation is not performed in the process of generating the CMP+ and the CMP–, when the absolute value of the amplitude of the input signal is larger than 0 and smaller than the threshold, if the IN+ is larger than the IN–, the process of generating the PWM+ and the PWM– is as shown in FIG. 17. Logical NOT operation is performed on the CMP+ to obtain the CMP+_INV, the CMP– is delayed for $T_d$ to obtain the CMP–_DELAY, and logical NOR operation is performed on the CMP+_INV and the CMP–_DELAY to obtain the PWM+. The PWM+ includes 1 pulse with a pulse width $T_{diff\,1}+T_d$, and a rising edge of the pulse is temporally aligned to a rising edge of a pulse included in the CMP+. Logical NOT operation is performed on the CMP– to obtain the CMP–_INV, the CMP+ is delayed for $T_d$ to obtain the CMP+_DELAY, and logical NOR operation is performed on the CMP–_INV and the CMP+_DELAY to obtain the PWM–. The PWM– includes 1 pulse with a pulse width $T_d-T_{diff\,2}$, and a rising edge of the pulse is temporally aligned to a rising edge of a pulse included in the CMP–. The PWM+ and the PWM– obtained in accordance with the logical operation method shown in FIG. 17 are consistent with the PWM+ and the PWM– shown in FIG. 5.

Figure 18:
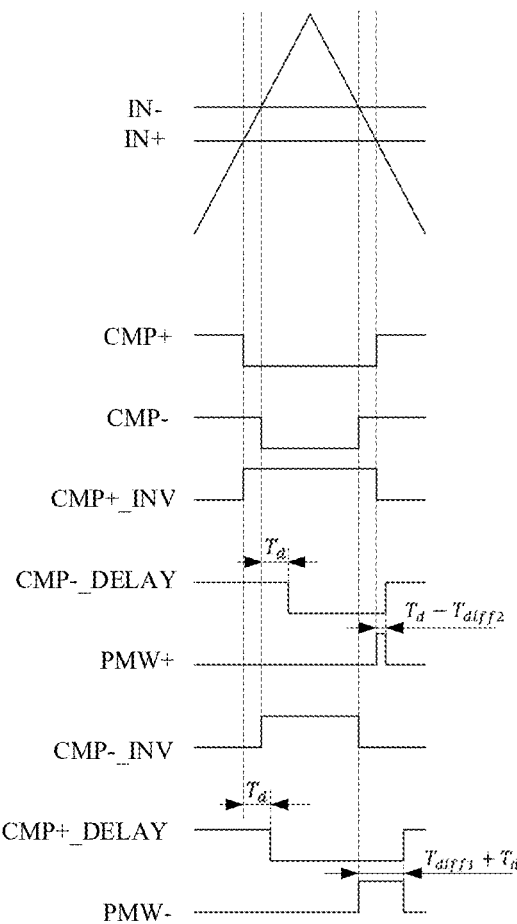
FIG. 18 is a schematic diagram of a process of generating a PWM positive signal and a PWM negative signal when an absolute value of an amplitude of an input signal is smaller than a threshold in another embodiment of the present disclosure.

In the case where inverse operation is not performed in the process of generating the CMP+ and the CMP–, when the absolute value of the amplitude of the input signal is larger than 0 and smaller than the threshold, if the IN+ is smaller than the IN–, the process of generating the PWM+ and the PWM– is as shown in FIG. 18. Logical NOT operation is performed on the CMP+ to obtain the CMP+_INV, the CMP is delayed for $T_d$ to obtain the CMP–_DELAY, and logical NOR operation is performed on the CMP+_INV and the CMP–_DELAY to obtain the PWM+. The PWM+ includes 1 pulse with a pulse width $T_d-T_{diff\,2}$, and a rising edge of the pulse is temporally aligned to a rising edge of a pulse included in the CMP+. Logical NOT operation is performed on the CMP– to obtain the CMP–_INV, the CMP+ is delayed for $T_d$ to obtain the CMP+_DELAY, and logical NOR operation is performed on the CMP–_INV and the CMP+_DELAY to obtain the PWM–. The PWM– includes 1 pulse with a pulse width $T_{diff\,1}+T_d$, and a rising edge of the pulse is temporally aligned to a rising edge of a pulse included in the CMP–. The PWM+ and the PWM– obtained in accordance with the logical operation method shown in FIG. 18 are consistent with the PWM+ and the PWM– shown in FIG. 6.

Figure 19:
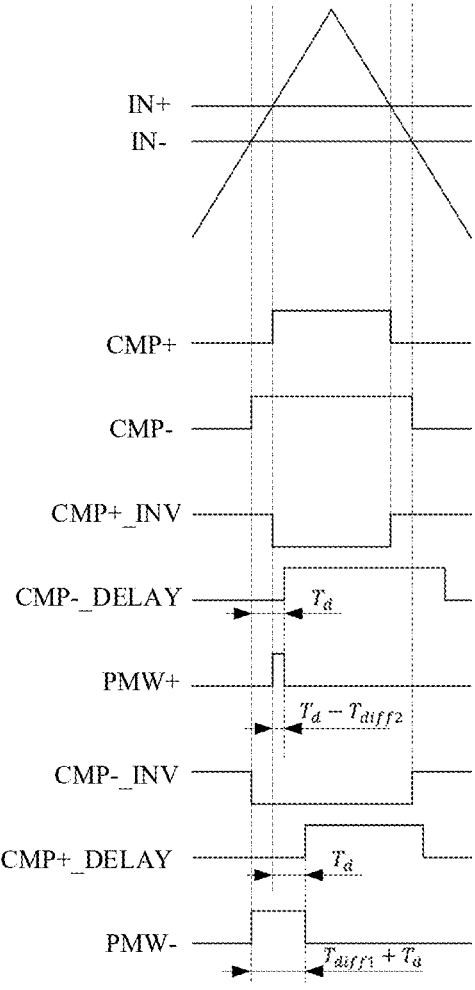
FIG. 19 is a schematic diagram of a process of generating a PWM positive signal and a PWM negative signal when an absolute value of an amplitude of an input signal is smaller than a threshold in still another embodiment of the present disclosure.

In the case where inverse operation is performed in the process of generating the CMP+ and the CMP–, when the absolute value of the amplitude of the input signal is larger than 0 and smaller than the threshold, if the IN+ is larger than the IN–, the process of generating the PWM+ and the PWM– is as shown in FIG. 19. Logical NOT operation is performed on the CMP+ to obtain the CMP+_INV, the CMP– is delayed for $T_d$ to obtain the CMP–_DELAY, and logical NOR operation is performed on the CMP+_INV and the CMP–_DELAY to obtain the PWM+. The PWM+ includes 1 pulse with a pulse width $T_d-T_{diff\,2}$, and a rising edge of the pulse is temporally aligned to a rising edge of a pulse included in the CMP+. Logical NOT operation is performed on the CMP– to obtain the CMP–_INV, the CMP+ is delayed for $T_d$ to obtain the CMP+_DELAY, and logical NOR operation is performed on the CMP–_INV and the CMP+_DELAY to obtain the PWM–. The PWM– includes 1 pulse with a pulse width $T_{diff\,1}+T_d$, and a rising edge of the pulse is temporally aligned to a rising edge of a pulse included in the CMP–. The PWM+ and the PWM– obtained in accordance with the logical operation method shown in FIG. 19 are consistent with the PWM+ and the PWM– shown in FIG. 7.

Figure 20:
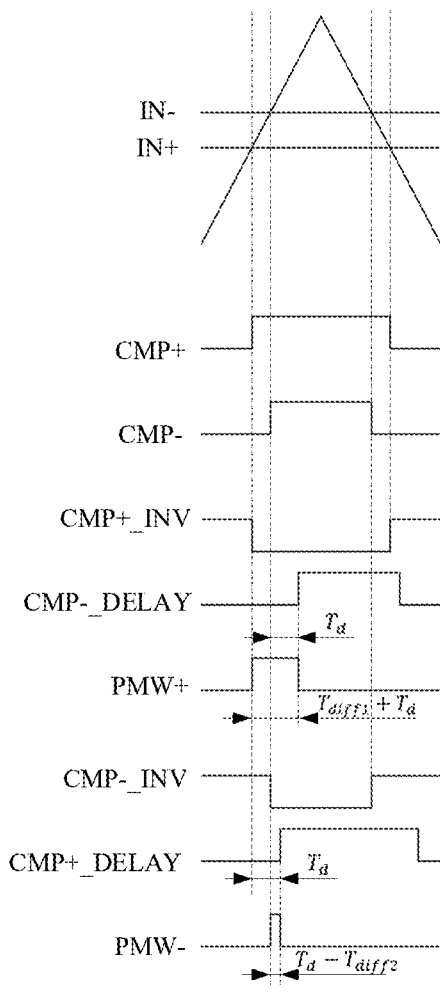
FIG. 20 is a schematic diagram of a process of generating a PWM positive signal and a PWM negative signal when an absolute value of an amplitude of an input signal is smaller than a threshold in yet another embodiment of the present disclosure.

In the case where inverse operation is performed in the process of generating the CMP+ and the CMP–, when the absolute value of the amplitude of the input signal is larger than 0 and smaller than the threshold, if the IN+ is smaller than the IN–, the process of generating the PWM+ and the PWM– is as shown in FIG. 20. Logical NOT operation is performed on the CMP+ to obtain the CMP+_INV, the CMP is delayed for $T_d$ to obtain the CMP–_DELAY, and logical NOR operation is performed on the CMP+_INV and the CMP–_DELAY to obtain the PWM+. The PWM+ includes 1 pulse with a pulse width $T_{diff\,1}+T_d$, and a rising edge of the pulse is temporally aligned to a rising edge of a pulse included in the CMP+. Logical NOT operation is performed on the CMP– to obtain the CMP–_INV, the CMP+ is delayed for $T_d$ to obtain the CMP+_DELAY, and logical NOR operation is performed on the CMP–_INV and the CMP+_DELAY to obtain the PWM–. The PWM– includes 1 pulse with a pulse width $T_d-T_{diff\,2}$, and a rising edge of the pulse is temporally aligned to a rising edge of a pulse included in the CMP–. The PWM+ and the PWM– obtained in accordance with the logical operation method shown in FIG. 20 are consistent with the PWM+ and the PWM– shown in FIG. 8.

Figure 21:
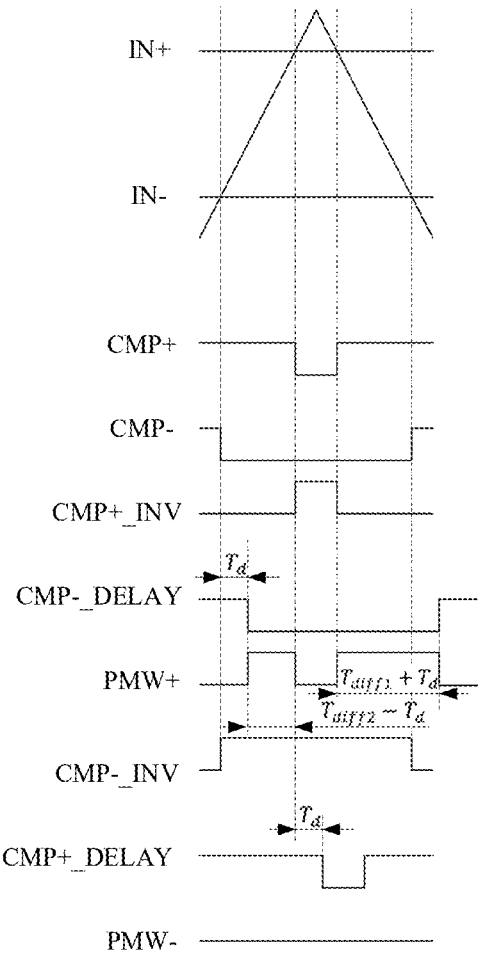
FIG. 21 is a schematic diagram of a process of generating a PWM positive signal and a PWM negative signal when an absolute value of an amplitude of an input signal is larger than a threshold in an embodiment of the present disclosure.

In the case where inverse operation is not performed in the process of generating the CMP+ and the CMP–, when the absolute value of the amplitude of the input signal is larger than the threshold, if the IN+ is larger than the IN–, the process of generating the PWM+ and the PWM– is as shown in FIG. 21. Logical NOT operation is performed on the CMP+ to obtain the CMP+_INV, the CMP is delayed for $T_d$ to obtain the CMP–_DELAY, and logical NOR operation is performed on the CMP+_INV and the CMP–_DELAY to obtain the PWM+. The PWM+ includes 1 pulse with a pulse width $T_{diff\,1}+T_d$ and 1 pulse with a pulse width $T_{diff\,2}-T_d$, a rising edge of the pulse with the pulse width $T_{diff\,1}+T_d$ is temporally aligned to a rising edge of a pulse included in the CMP+, and a falling edge of the pulse with the pulse width $T_{diff\,2}-T_d$ is temporally aligned to a falling edge of the pulse included in the CMP+. Logical NOT operation is performed on the CMP– to obtain the CMP–_INV, the CMP+ is delayed for $T_d$ to obtain the CMP+_DELAY, logical NOR operation is performed on the CMP–_INV and the CMP+_DELAY to obtain the PWM–, and the PWM– does not include a pulse. The PWM+ and the PWM– obtained in accordance with the logical operation method shown in FIG. 21 are consistent with the PWM+ and the PWM– shown in FIG. 9.

Figure 22:
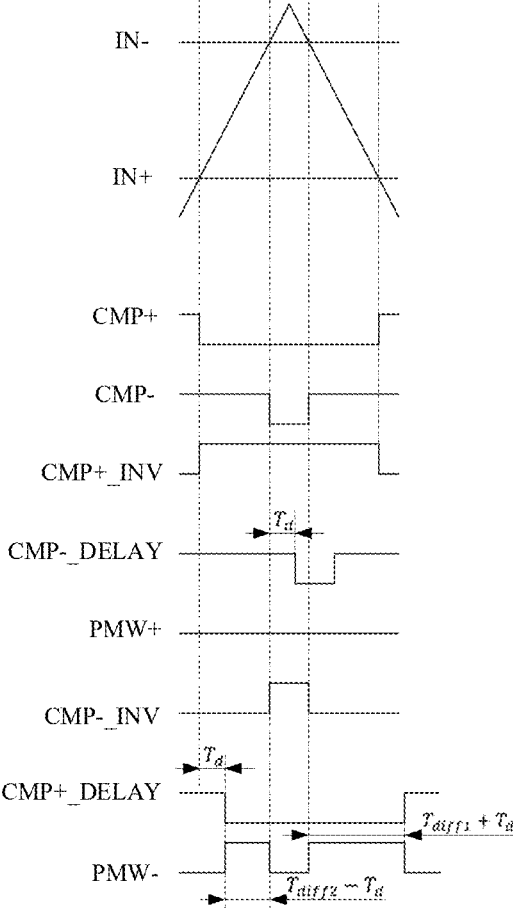
FIG. 22 is a schematic diagram of a process of generating a PWM positive signal and a PWM negative signal when an absolute value of an amplitude of an input signal is larger than a threshold in another embodiment of the present disclosure.

In the case where inverse operation is not performed in the process of generating the CMP+ and the CMP–, when the absolute value of the amplitude of the input signal is larger than the threshold, if the IN+ is smaller than the IN–, the process of generating the PWM+ and the PWM– is as shown in FIG. 22. Logical NOT operation is performed on the CMP+ to obtain the CMP+_INV, the CMP− is delayed for $T_d$ to obtain the CMP−_DELAY, logical NOR operation is performed on the CMP+_INV and the CMP−_DELAY to obtain the PWM+, and the PWM+ does not include a pulse. Logical NOT operation is performed on the CMP− to obtain the CMP−_INV, the CMP+ is delayed for $T_d$ to obtain the CMP+_DELAY, and logical AND operation is performed on the CMP−_INV and the CMP+_DELAY to obtain the PWM−. The PWM− includes 1 pulse with a pulse width $T_{diff\,1}+T_d$ and 1 pulse with a pulse width $T_{diff\,2}-T_d$, a rising edge of the pulse with the pulse width $T_{diff\,1}+T_d$ is temporally aligned to a rising edge of a pulse included in the CMP−, and a falling edge of the pulse with the pulse width $T_{diff\,2}-T_d$ is temporally aligned to a falling edge of the pulse included in the CMP−. The PWM+ and the PWM− obtained in accordance with the logical operation method shown in FIG. 22 are consistent with the PWM+ and the PWM− shown in FIG. 10.

Figure 23:
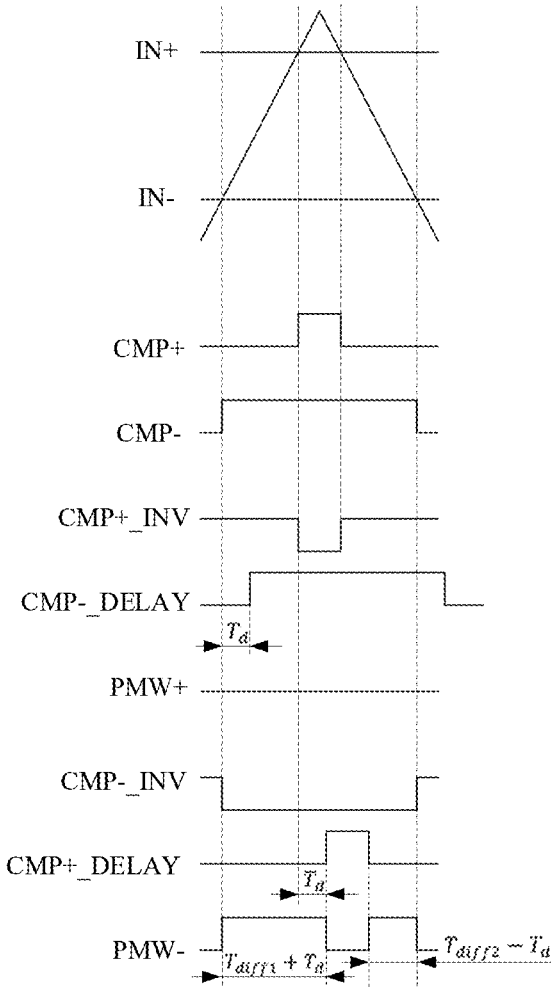
FIG. 23 is a schematic diagram of a process of generating a PWM positive signal and a PWM negative signal when an absolute value of an amplitude of an input signal is larger than a threshold in still another embodiment of the present disclosure.

In the case where inverse operation is performed in the process of generating the CMP+ and the CMP−, when the absolute value of the amplitude of the input signal is larger than the threshold, if the IN+ is larger than the IN−, the process of generating the PWM+ and the PWM− is as shown in FIG. 23. Logical NOT operation is performed on the CMP+ to obtain the CMP+_INV, the CMP− is delayed for $T_d$ to obtain the CMP−_DELAY, logical NOR operation is performed on the CMP+_INV and the CMP−_DELAY to obtain the PWM+, and the PWM+ does not include a pulse. Logical NOT operation is performed on the CMP− to obtain the CMP−_INV, the CMP+ is delayed for $T_d$ to obtain the CMP+_DELAY, and logical NOR operation is performed on the CMP−_INV and the CMP+_DELAY to obtain the PWM−. The PWM− includes 1 pulse with a pulse width $T_{diff\,1}+T_d$ and 1 pulse with a pulse width $T_{diff\,2}-T_d$, a rising edge of the pulse with the pulse width $T_{diff\,1}+T_d$ is temporally aligned to a rising edge of a pulse included in the CMP−, and a falling edge of the pulse with the pulse width $T_{diff\,2}-T_d$ is temporally aligned to a falling edge of the pulse included in the CMP−. The PWM+ and the PWM− obtained in accordance with the logical operation method shown in FIG. 23 are consistent with the PWM+ and the PWM− shown in FIG. 11.

Figure 24:
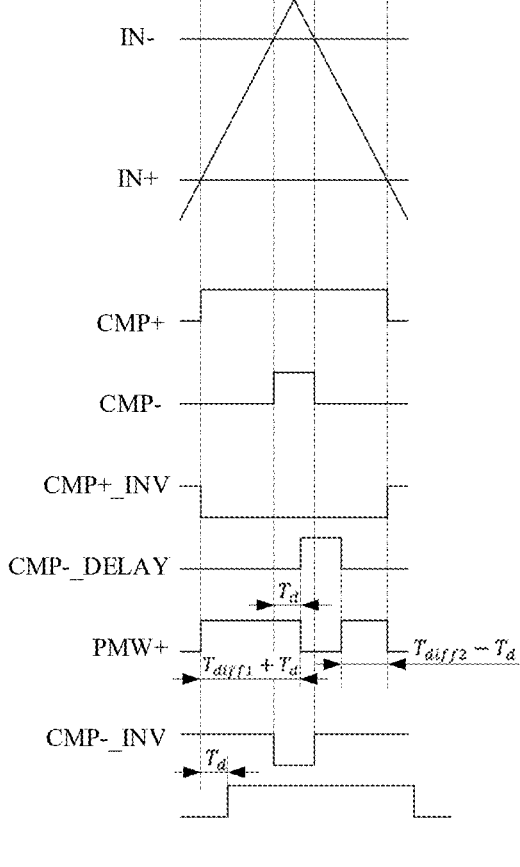
FIG. 24 is a schematic diagram of a process of generating a PWM positive signal and a PWM negative signal when an absolute value of an amplitude of an input signal is larger than a threshold in yet another embodiment of the present disclosure.

In the case where inverse operation is performed in the process of generating the CMP+ and the CMP−, when the absolute value of the amplitude of the input signal is larger than the threshold, if the IN+ is larger than the IN−, the process of generating the PWM+ and the PWM− is as shown in FIG. 24. Logical NOT operation is performed on the CMP+ to obtain the CMP+_INV, the CMP− is delayed for $T_d$ to obtain the CMP−_DELAY, and logical NOR operation is performed on the CMP+_INV and the CMP−_DELAY to obtain the PWM+. The PWM+ includes 1 pulse with a pulse width $T_{diff\,1}+T_d$ and 1 pulse with a pulse width $T_{diff\,2}-T_d$, a rising edge of the pulse with the pulse width $T_{diff\,1}+T_d$ is temporally aligned to a rising edge of a pulse included in the CMP+, and a falling edge of the pulse with the pulse width $T_{diff\,2}-T_d$ is temporally aligned to a falling edge of the pulse included in the CMP+. Logical NOT operation is performed on the CMP− to obtain the CMP−_INV, the CMP+ is delayed for $T_d$ to obtain the CMP+_DELAY, logical NOR operation is performed on the CMP−_INV and the CMP+_DELAY to obtain the PWM−, and the PWM− does not include a pulse. The PWM+ and the PWM− obtained in accordance with the logical operation method shown in FIG. 24 are consistent with the PWM+ and the PWM− shown in FIG. 12.

In an embodiment of the present disclosure, by presetting the delay duration, the CMP+ and the CMP− can be delayed to obtain delayed signals, inverse (logical NOT) operation is performed on the CMP+ and the CMP− to obtain inversion signals, and then logical NOR operation can be performed on the delayed signals and the inversion signals to obtain the PWM+ and the PWM−, without the need for generating the PWM+ and the PWM− by feedback, so that the signal processing is simpler, the loop of the whole system is simpler, a common mode pulse width of the PWM+ and the PWM− is determined by a delay unit that generates the delay duration, and fluctuations of the power supply voltage have little impact on the common mode pulse width of the PWM+ and the PWM−. Since it is not necessary to set a specialized differential signal pulse width detection circuit for common mode switching, common mode switching is performed based on a differential signal and the delay duration of the CMP+ and the CMP− to generate the PWM+ and the PWM−. As the differential mode pulse width of the CMP+ and the CMP− increases, gradual decrease of the common mode component of the PWM+ and the PWM− is a smooth and automatic transformation process, and in this process, the differential signal in the differential mode pulse width of the CMP+ and the CMP− does not have losses, so that common mode signals of the PWM+ and the PWM− will not mutate, thus ensuring that the amplitude of the input signal will not mutate at 0 and the preset threshold, and ensuring the quality of signal processing.

It should be noted that, in the above embodiments, the $T_{diff\,1}$ and the $T_{diff\,2}$ are pulse widths of 2 pulses included in the differential mode signal of the CMP+ and the CMP−, and the $T_{diff\,1}$ may be same as, or may be different from, the $T_{diff\,2}$. When a rising slope and a falling slope of the triangular wave are equal, the $T_{diff\,1}$ is same as the $T_{diff\,2}$, and when the rising slope and the falling slope of the triangular wave are unequal, the $T_{diff\,1}$ is different from the $T_{diff\,2}$.

In a possible implementation, the absolute value of the amplitude of the input signal may be classified into 3 segments based on the preset threshold, the amplitude of the input signal equal to 0 is defined as the standby state, the absolute value of the amplitude of the input signal larger than 0 and smaller than the threshold is defined as a small amplitude segment, and the absolute value of the amplitude of the input signal larger than the threshold is defined as a large amplitude segment. As can be seen from FIGS. 3-24 and the description of the above text, a critical condition from the standby state to the small amplitude segment is that the pulse widths of the pulses included in the PWM+ become different from the pulse widths of the pulses included in the PWM−, and a critical condition from the small amplitude segment to the large amplitude segment is that: within one pulse period, a sum of differential mode pulse widths of the PWM+ and the PWM− becomes larger than twice as long as the delay duration, i.e., the large amplitude segment begins when the common mode pulse width of the PWM+ and the PWM− becomes smaller and smaller, until 0. Therefore, the delay duration is set to adjust a demarcation point between the small amplitude segment and the large amplitude segment.

A value range of the delay duration is [T/40, T/10], wherein T is used to represent a duration of the pulse period. For example, the delay duration may be, e.g., T/40, T/30, T/20, or T/10.

It should be noted that the delay duration may be a preset constant value, or may be dynamically changing. For example, when the input signal is an analog signal or a digital signal, the pulse width threshold may be a preset constant value. When the input signal is a digital signal, the delay duration may be dynamically adjusted based on the power of the input signal, to balance between the performance of the output signal and the power consumption of signal processing.

In an embodiment of the present disclosure, the delay duration is used to set a maximum value of common mode pulse width change of the positive input signal and the negative input signal when the magnitude of the input signal is switched. Moreover, the delay duration also determines pulse widths of pulses included in the positive output signal and the negative output signal in the standby state. The larger the delay duration is, the more the standby power consumption is. Moreover, since there is a lower limit for a minimum pulse width to which a post-stage circuit can respond, when the value range of the delay duration is [T/40, T/10], the delay duration not only can satisfy the loop response, but also can minimize the standby power consumption. By setting a small delay duration, a small output pulse width can be used as a common mode output in the standby state on the premise of satisfying the system design, thereby ensuring low power consumption in the standby state.

In a possible implementation, when the positive output signal and the negative output signal are outputted based on the PWM+ and the PWM−, an amplitude of the PWM+ can be amplified to obtain the negative output signal, and an amplitude of the PWM− can be amplified to obtain the positive output signal, or an amplitude of the PWM+ can be amplified to obtain the positive output signal, and an amplitude of the PWM− can be amplified to obtain the negative output signal.

The amplifying the amplitudes of the PWM+ and the PWM− means to amplify amplitudes of pulses included in the PWM+ and the PWM− without changing the number, rising edge positions, and falling edge positions of the pulses included in the PWM+ and the PWM−. For example, a voltage corresponding to a pulse included in the PWM+ is 5V, and the amplitude of the PWM+ is amplified to 20V to obtain the positive output signal or the negative output signal.

When the positive output signal and the negative output signal are outputted based on the PWM+ and the PWM−, inverse operation may be performed, or may not be performed. If inverse operation is performed, the amplitude of the PWM+ is amplified to obtain the negative output signal, the amplitude of the PWM− is amplified to obtain the positive output signal. If inverse operation is not performed, the amplitude of the PWM+ is amplified to obtain thee positive output signal, and the amplitude of the PWM− is amplified to obtain the negative output signal.

It should be noted that in a process of processing the input signal to obtain the positive output signal and the negative output signal, an inverse operation is required. This inverse operation may be performed in a process of generating the IN+ and the IN− based on the input signal, or may be performed in a process of generating the CMP+ and the CMP− based on the IN+ and the IN−, or may be performed in a process of generating the PWM+ and the PWM− based on the CMP+ and the CMP−, or may be performed in a process of generating the positive output signal and the negative output signal based on the PWM+ and the PWM−. In the above embodiments, a process of performing inverse operation in the process of generating the CMP+ and the CMP− based on the IN+ and the IN− is described. The implementations of performing inverse operation in the process of generating the IN+ and the IN− based on the input signal, performing inverse operation in the process of generating the PWM+ and the PWM− based on the CMP+ and the CMP−, and performing inverse operation in the process of generating the positive output signal and the negative output signal based on the PWM+ and the PWM− are similar to the process of performing inverse operation in the process of generating the CMP+ and the CMP− based on the IN+ and the IN−, and will not be repeated here.

In an embodiment of the present disclosure, when the positive output signal and the negative output signal are outputted based on the PWM+ and the PWM−, the amplitudes of the PWM+ and the PWM− are amplified to obtain the positive output signal and the negative output signal, so that the positive output signal and the negative output signal can drive a device, such as a speaker. In the process of outputting the positive output signal and the negative output signal based on the PWM+ and the PWM−, inverse operation may be performed, or may not be performed, thereby satisfying different application scenario requirements, and improving the applicability of the method for signal processing in the embodiments of the present disclosure.

In a possible implementation, the input signal may be an audio signal, the positive output signal and the negative output signal may be used to drive a speaker, and the speaker is configured to play the audio signal after signal processing. In an example, the positive output signal may be used as a positive terminal input of the speaker, and the negative output signal may be used as a negative terminal input of the speaker.

In an embodiment of the present disclosure, the audio signal is processed in accordance with the method for signal processing in the above embodiments, so that the audio signal processing is more efficient, thereby improving the efficiency without the need of using an advanced technology in the whole audio system, and improving the efficiency of signal processing in an audio system using an ordinary technology by optimizing the switching frequency and the switching mode.

Circuit for Signal Processing

Figure 25:
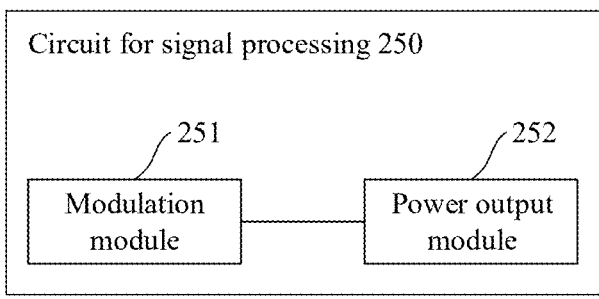
FIG. 25 is a schematic diagram of a circuit for signal processing in an embodiment of the present disclosure.

FIG. 25 shows a schematic diagram of a circuit for signal processing in an embodiment of the present disclosure. As shown in FIG. 25, the circuit 250 for signal processing includes a modulation module 251 and a power output module 252, wherein the modulation module 251 is configured to perform PWM modulation on an input signal to obtain a PWM positive signal and a PWM negative signal, and the power output module 252 is configured to output a positive output signal and a negative output signal based on the PWM positive signal and the PWM negative signal; wherein, in response to an absolute value of an amplitude of the input signal being larger than a threshold, one output signal of the positive output signal and the negative output signal does not include a pulse, and the other output signal of the positive output signal and the negative output signal includes 2 pulses within one pulse period.

In an embodiment of the present disclosure, the modulation module 251 performs PWM modulation on the input signal to obtain the PWM positive signal and the PWM negative signal, and the power output module 252 outputs the positive output signal and the negative output signal based on the PWM positive signal and the PWM negative signal, wherein, when the absolute value of the amplitude of the input signal is larger than the threshold, one of the positive output signal and the negative output signal does not include a pulse, and the other one thereof includes 2 pulses within one pulse period, that is, the positive output signal and the negative output signal does not have a common mode component, and a differential signal of the positive output signal and the negative output signal is concentrated on a single side, so that a differential mode pulse width of the positive output signal and the negative output signal does not have losses. Moreover, since pulses included in the positive output signal and the negative output signal are generated based on switching of a switching tube in the circuit, only one of the positive output signal and the negative output signal includes a pulse, thereby reducing the switching frequency in a process of generating the positive output signal and the negative output signal, and improving the output efficiency. In the PWM process, the number of occurrences of pulses per unit time is positively correlated to the suppression effects on the loop nonlinearity and noise. When the absolute value of the amplitude of the input signal is larger than the threshold, one of the positive output signal and the negative output signal includes 2 pulses within one pulse period, thereby improving the suppression effects on the loop nonlinearity and noise when the absolute value of the amplitude of the input signal is large, and improving the performance of the output signal.

In a possible implementation, in the circuit 250 for signal processing as shown in FIG. 26, the modulation module 251 includes a loop filter unit 2511, a comparison unit 2512, and a logical operation unit 2513; wherein the loop filter unit 2511 is configured to filter the input signal to obtain a first positive signal and a first negative signal;

the comparison unit 2512 is configured to compare the first positive signal and the first negative signal with a triangular wave signal, and generate a second positive signal and a second negative signal based on a comparison result, wherein a period of the triangular wave is equal to the pulse period, and each of the second positive signal and the second negative signal is a square wave signal; and the logical operation unit 2513 is configured to generate the PWM positive signal and the PWM negative signal based on the second positive signal, the second negative signal, and a preset delay duration.

The positive output signal and the negative output signal outputted from the power output module 252 may be fed back to the loop filter unit 2511. The loop filter unit 2511 filters the positive input signal and the negative input signal based on the feedback signals from the power output module 252, to achieve loop filtering.

In a possible implementation, the logical operation unit 2513 is configured to:

perform differential mode pulse width extraction on the second positive signal and the second negative signal to obtain a first positive differential mode signal and a first negative differential mode signal;

perform differential mode pulse width detection on the first positive differential mode signal and the first negative differential mode signal, to obtain a second positive differential mode signal and a second negative differential mode signal;

perform common mode pulse width generation based on the first positive differential mode signal, the first negative differential mode signal, the second positive differential mode signal, and the second negative differential mode signal, to obtain a positive common mode signal and a negative common mode signal;

perform differential mode pulse width generation based on the first positive differential mode signal and the first negative differential mode signal, to obtain a third positive differential mode signal and a third negative differential mode signal; and perform PWM signal generation based on the positive common mode signal, the negative common mode signal, the third positive differential mode signal, the third negative differential mode signal, and the delay duration, to obtain the PWM positive signal and the PWM negative signal.

In a possible implementation, the logical operation unit 2513 is configured to:

perform logical NOT operation on the second positive signal to obtain a first inversion signal;

delay the second negative signal for the set delay duration to obtain a first delayed signal;

perform logical NOR operation on the first inversion signal and the first delayed signal to obtain the PWM positive signal;

perform logical NOT operation on the second negative signal to obtain a second inversion signal;

delay the first positive signal for the delay duration to obtain a second delayed signal; and perform logical NOR operation on the second inversion signal and the second delayed signal to obtain the PWM negative signal.

It should be noted that the circuit for signal processing in the embodiments of the present disclosure is configured to implement the method for signal processing in the above embodiments, and is based on the same concept as the method for signal processing in the above embodiments. The method for signal processing in the above embodiments may be referred to for specific contents and beneficial effects, which will not be repeated here.

Chip for Signal Processing

An embodiment of the present disclosure provides a chip for signal processing. The chip for signal processing is configured to implement the method for signal processing in any one of the above embodiments. The chip for signal processing may include the circuit 250 for signal processing in any one of the above embodiments, that is, the circuit 250 for signal processing in the above embodiments is encapsulated in a chip, and the chip for signal processing may be arranged in an electronic device with signal processing requirements, such as audio signals or power supply signals, for signal processing.

It should be noted that the chip for signal processing in the embodiments of the present disclosure is configured to implement the method for signal processing in the above embodiments, and is based on the same concept as the method for signal processing in the above embodiments. The method for signal processing in the above embodiments may be referred to for specific contents and beneficial effects, which will not be repeated here.

Electronic Device

Figure 27:
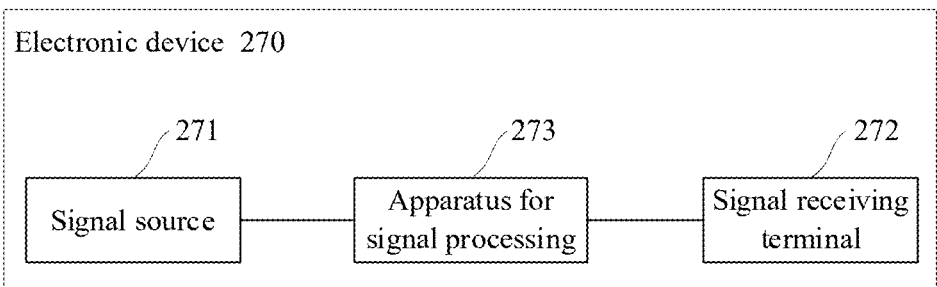
FIG. 27 is a schematic diagram of an electronic device in an embodiment of the present disclosure.

FIG. 27 shows a schematic diagram of an electronic device in an embodiment of the present disclosure. As shown in FIG. 27, the electronic device 270 includes a signal source 271, a signal receiving terminal 272, and an apparatus 273 for signal processing. The apparatus 273 for signal processing may include the circuit 250 for signal processing or the chip for signal processing in any one of the above embodiments.

The apparatus 273 for signal processing is connected between the signal source 271 and the signal receiving terminal 272, the signal source 271 is configured to transmit an input signal to the apparatus 273 for signal processing, and the signal receiving terminal 272 is configured to receive the positive output signal and the negative output signal outputted from the apparatus 273 for signal processing.

The input signal transmitted from the signal source 271 to the apparatus 273 for signal processing may be an audio signal. After receiving the positive output signal and the negative output signal, the signal receiving terminal 272 may perform LC filtering on the positive output signal and the negative output signal, and then transmit the filtered signals to a speaker, to drive the speaker to produce sound.

It should be noted that the electronic device in the embodiments of the present disclosure is implemented based on the circuit 250 for signal processing or the chip for signal processing in the above embodiments, and is a specific application of the circuit 250 for signal processing or the chip for signal processing in the above embodiments. The description of the signal processing unit in the above embodiments and the chip for signal processing in the above embodiments may be referred to for specific contents and beneficial effects, which will not be repeated here.

It should be understood that the embodiments in the present specification are described progressively, identical or similar portions between the embodiments may be mutually referred to, and differences of each embodiment from other embodiments are mainly described in the embodiment. In particular, the method embodiments are substantially similar to the method described in the apparatus and system embodiments, which are therefore relatively simply described. A part of description of other embodiments may be referred to for relevant details.

It should be understood that particular embodiments of the present specification are described above. Other embodiments are encompassed within the scope of the claims. In some cases, actions or steps disclosed in the claims may be executed in an order different from that in embodiments, and can still achieve desired results. In addition, the processes depicted in the drawings are not necessarily required to achieve the desired results in the shown particular order or in a sequential order. In some embodiments, multitasking and parallel processing may also be feasible, or may be advantageous.

It should be understood that an element described herein in a singular form or only one of the element shown in the drawings does not mean that the number of the element is limited to one. Further, modules or elements described or shown as separate modules or elements herein may be combined into a single module or element, and a module or element described or shown as a single module or element herein may be split into a plurality of modules or elements.

It should be further understood that the terms and expressions used herein are for description only, and one or more embodiments of the present specification should not be limited to these terms and expressions. The use of these terms and expressions does not mean to exclude equivalent features of any illustrations and descriptions (or parts thereof), and it should be appreciated that various possible modifications should also be included within the scope of the claims. There may also be other modifications, alterations, and replacements. Accordingly, the claims should be deemed to cover all these equivalents.

The invention claimed is:

1. A method for signal processing, comprising:
performing PWM modulation on an input signal to obtain a PWM positive signal and a PWM negative signal; and
outputting a positive output signal and a negative output signal based on the PWM positive signal and the PWM negative signal; wherein
in response to an absolute value of an amplitude of the input signal being larger than a threshold, one output signal of the positive output signal and the negative output signal does not include a pulse, and the other output signal of the positive output signal and the negative output signal includes 2 pulses within one pulse period.

2. The method according to claim 1, wherein
in response to an absolute value of an amplitude of the input signal being larger than 0 and smaller than the threshold, each of the positive output signal and the negative output signal includes 1 pulse within one pulse period, and a pulse width of a differential mode signal of the positive output signal and the negative output signal is larger than 0.

3. The method according to claim 2, wherein
in response to the amplitude of the input signal being equal to 0, each of the positive output signal and the negative output signal includes 1 pulse within one pulse period, and the pulse width of the differential mode signal of the positive output signal and the negative output signal is equal to 0.

4. The method according to claim 3, wherein the pulse width of the differential mode signal of the positive output signal and the negative output signal is positively correlated to the absolute value of the amplitude of the input signal.

5. The method according to claim 3, wherein
in response to the amplitude of the input signal being equal to 0, a pulse width of the pulse included in each of the positive output signal and the negative output signal is equal to a preset delay duration;
in response to the absolute value of the amplitude of the input signal being larger than 0 and smaller than the threshold, a pulse width of a pulse included in one output signal of the positive output signal and the negative output signal is larger than the delay duration, and a pulse width of a pulse included in the other output signal of the positive output signal and the negative output signal is smaller than the delay duration; and
in response to the absolute value of the amplitude of the input signal being larger than the threshold, a pulse width of at least one pulse included in the positive output signal or the negative output signal is larger than the delay duration.

6. The method according to claim 3, wherein the performing PWM modulation on the input signal to obtain the PWM positive signal and the PWM negative signal includes:
filtering the input signal to obtain a first positive signal and a first negative signal;
comparing the first positive signal and the first negative signal with a triangular wave signal, and generating a second positive signal and a second negative signal based on a comparison result, wherein a period of the triangular wave is equal to the pulse period, and each of the second positive signal and the second negative signal is a square wave signal; and
generating the PWM positive signal and the PWM negative signal based on the second positive signal, the second negative signal, and a preset delay duration.

7. The method according to claim 6, wherein, when the amplitude of the input signal is equal to 0, pulse widths of pulses included in the PWM positive signal and the PWM negative signal are each equal to the delay duration, and leading edges of the pulses included in the PWM positive signal and the PWM negative signal are all temporally aligned to rising edges of pulses included in the second positive signal and the second negative signal.

8. The method according to claim 6, wherein, in response to the absolute value of the amplitude of the input signal being larger than 0 and smaller than the threshold, a rising edge of a pulse included in the PWM positive signal is temporally aligned to a rising edge of a pulse included in the second positive signal, and a rising edge of a pulse included in the PWM negative signal is temporally aligned to a rising edge of a pulse included in the second negative signal; in response to the first positive signal being larger than the first negative signal, a pulse width of the pulse included in the PWM positive signal is $T_{diff\,1}+T_d$, and a pulse width of the pulse included in the PWM negative signal is $T_d-T_{diff\,2}$; and in response to the first positive signal being smaller than the first negative signal, the pulse width of the pulse included in the PWM positive signal is $T_d-T_{diff\,2}$, and the pulse width of the pulse included in the PWM negative signal is $T_{diff\,1}+T_d$;

wherein the $T_{diff\,1}$ and $T_{diff\,2}$ are used to represent pulse widths of 2 pulses included in a differential mode signal of the second positive signal and the second negative signal, and the $T_d$ is used to represent the delay duration.

9. The method according to claim 6, wherein, when the absolute value of the amplitude of the input signal is larger than the threshold, in response to pulses included in the second positive signal and the second negative signal being low levels, the PWM positive signal and the PWM negative signal satisfy: in response to the first positive signal being larger than the first negative signal, pulse widths of 2 pulses included in the PWM positive signal are $T_{diff\,1}+T_d$ and $T_{diff\,2}-T_d$ respectively, and the PWM negative signal does not include a pulse; in response to the first positive signal being smaller than the first negative signal, pulse widths of 2 pulses included in the PWM negative signal are $T_{diff\,1}+T_d$ and $T_{diff\,2}-T_d$ respectively, and the PWM positive signal does not include a pulse;

in response to the pulses included in the second positive signal and the second negative signal being high levels, the PWM positive signal and the PWM negative signal satisfy: in response to the first positive signal being larger than the first negative signal, the pulse widths of the 2 pulses included in the PWM negative signal are $T_{diff\,1}+T_d$ and $T_{diff\,2}-T_d$ respectively, and the PWM positive signal does not include a pulse; in response to the first positive signal being smaller than the first negative signal, the pulse widths of the 2 pulses included in the PWM positive signal are $T_{diff\,1}+T_d$ and $T_{diff\,2}-T_d$ respectively, and the PWM negative signal does not include a pulse;

when the PWM positive signal includes 2 pulses, a rising edge of a pulse with the pulse width $T_{diff\,1}+T_d$ included in the PWM positive signal is temporally aligned to a rising edge of a pulse included in the second positive signal, and a falling edge of a pulse with the pulse width $T_{diff\,2}-T_d$ included in the PWM positive signal is temporally aligned to a falling edge of a pulse included in the second positive signal; and when the PWM negative signal includes 2 pulses, a rising edge of a pulse with the pulse width $T_{diff\,1}+T_d$ included in the PWM negative signal is temporally aligned to a rising edge of a pulse included in the second negative signal, and a falling edge of a pulse with the pulse width $T_{diff\,2}-T_d$ included in the PWM negative signal is temporally aligned to a falling edge of a pulse included in the second negative signal;

wherein the $T_{diff\,1}$ and $T_{diff\,2}$ are used to represent pulse widths of 2 pulses included in a differential mode signal of the second positive signal and the second negative signal, and the $T_d$ is used to represent the delay duration.

10. The method according to claim 6, wherein the generating the PWM positive signal and the PWM negative signal based on the second positive signal, the second negative signal, and the preset delay duration includes:

performing differential mode pulse width extraction on the second positive signal and the second negative signal to obtain a first positive differential mode signal and a first negative differential mode signal;

performing differential mode pulse width detection on the first positive differential mode signal and the first negative differential mode signal to obtain a second positive differential mode signal and a second negative differential mode signal;

performing common mode pulse width generation based on the first positive differential mode signal, the first negative differential mode signal, the second positive differential mode signal, and the second negative differential mode signal, to obtain a positive common mode signal and a negative common mode signal;

performing differential mode pulse width generation based on the first positive differential mode signal and the first negative differential mode signal, to obtain a third positive differential mode signal and a third negative differential mode signal; and performing PWM signal generation based on the positive common mode signal, the negative common mode signal, the third positive differential mode signal, the third negative differential mode signal, and the delay duration, to obtain the PWM positive signal and the PWM negative signal.

11. The method according to claim 6, wherein the generating the PWM positive signal and the PWM negative signal based on the second positive signal, the second negative signal, and the preset delay duration includes:

performing logical NOT operation on the second positive signal to obtain a first inversion signal;

delaying the second negative signal for the delay duration to obtain a first delayed signal;

performing logical NOR operation on the first inversion signal and the first delayed signal to obtain the PWM positive signal;

performing logical NOT operation on the second negative signal to obtain a second inversion signal;

delaying the first positive signal for the delay duration to obtain a second delayed signal; and performing logical NOR operation on the second inversion signal and the second delayed signal to obtain the PWM negative signal.

12. The method according to claim 5, wherein a value range of the delayed duration is [T/40, T/10], wherein T is used to represent a duration of the pulse period.

13. The method according to claim 6, wherein the outputting the positive output signal and the negative output signal based on the PWM positive signal and the PWM negative signal includes:

amplifying an amplitude of the PWM positive signal to obtain the negative output signal, and amplifying an amplitude of the PWM negative signal to obtain the positive output signal; or amplifying the amplitude of the PWM positive signal to obtain the positive output signal, and amplifying the amplitude of the PWM negative signal to obtain the negative output signal.

14. The method according to claim 1, wherein the input signal is an audio signal, the positive output signal and the negative output signal are used to drive a speaker, and the speaker is configured to play the audio signal after signal processing.

15. The method according to claim 5, wherein in response to the absolute value of the amplitude of the input signal being larger than 0 and smaller than the threshold, neither rising edges nor falling edges of the pulses of the positive output signal and the negative output signal are temporally aligned, and midpoints of the pulses included in the positive output signal and the negative output signal are temporally aligned, so that the pulse width of the differential mode signal of the positive output signal and the negative output signal is not equal to 0, and increases with the increase of the absolute value of the amplitude of the input signal, and decreases with the decrease of the absolute value of the amplitude of the input signal to match the differential mode signal of the positive output signal and the negative output signal with the input signal.

16. A circuit for signal processing, comprising:
   a modulation module configured to perform PWM modulation on an input signal to obtain a PWM positive signal and a PWM negative signal; and
   a power output module configured to output a positive output signal and a negative output signal based on the PWM positive signal and the PWM negative signal; wherein
   in response to an absolute value of an amplitude of the input signal being larger than a threshold, one output signal of the positive output signal and the negative output signal does not include a pulse, and the other output signal of the positive output signal and the negative output signal includes 2 pulses within one pulse period.

17. The circuit according to claim 16, wherein the modulation module includes: a loop filter unit, a comparison unit, and a logical operation unit; wherein
   the loop filter unit is configured to filter the input signal to obtain a first positive signal and a first negative signal;
   the comparison unit is configured to compare the first positive signal and the first negative signal with a triangular wave signal, and generate a second positive signal and a second negative signal based on a comparison result, wherein a period of the triangular wave is equal to the pulse period, and each of the second positive signal and the second negative signal is a square wave signal; and
   the logical operation unit is configured to generate the PWM positive signal and the PWM negative signal based on the second positive signal, the second negative signal, and a preset delay duration.

18. The circuit according to claim 17, wherein the logical operation unit is configured to:
   perform differential mode pulse width extraction on the second positive signal and the second negative signal to obtain a first positive differential mode signal and a first negative differential mode signal;
   perform differential mode pulse width detection on the first positive differential mode signal and the first negative differential mode signal to obtain a second positive differential mode signal and a second negative differential mode signal;
   perform common mode pulse width generation based on the first positive differential mode signal, the first negative differential mode signal, the second positive differential mode signal, and the second negative differential mode signal, to obtain a positive common mode signal and a negative common mode signal;
   perform differential mode pulse width generation based on the first positive differential mode signal and the first negative differential mode signal, to obtain a third positive differential mode signal and a third negative differential mode signal; and
   perform PWM signal generation based on the positive common mode signal, the negative common mode signal, the third positive differential mode signal, the third negative differential mode signal, and the delay duration, to obtain the PWM positive signal and the PWM negative signal.

19. The circuit according to claim 17, wherein the logical operation unit is configured to:
   perform logical NOT operation on the second positive signal to obtain a first inversion signal;
   delay the second negative signal for the delay duration to obtain a first delayed signal;
   perform logical NOR operation on the first inversion signal and the first delayed signal to obtain the PWM positive signal;
   perform logical NOT operation on the second negative signal to obtain a second inversion signal;
   delay the first positive signal for the delay duration to obtain a second delayed signal; and
   perform logical NOR operation on the second inversion signal and the second delayed signal to obtain the PWM negative signal.

20. A chip for signal processing, wherein the chip for signal processing is configured to implement the method according to claim 1.

\* \* \* \* \*